US011605571B2

(12) United States Patent
Teixeira De Queiros et al.

(10) Patent No.: US 11,605,571 B2
(45) Date of Patent: Mar. 14, 2023

(54) PACKAGE COMPRISING A SUBSTRATE, AN INTEGRATED DEVICE, AND AN ENCAPSULATION LAYER WITH UNDERCUT

(71) Applicant: QUALCOMM Incorporated, San Diego, CA (US)

(72) Inventors: Alberto Jose Teixeira De Queiros, Munich (DE); Andreas Franz, Munich (DE); Anna Katharina Krefft, Munich (DE); Claus Reitlinger, Wolnzach (DE)

(73) Assignee: QUALCOMM INCORPORATED, San Diego, CA (US)

( * ) Notice: Subject to any disclaimer, the term of this patent is extended or adjusted under 35 U.S.C. 154(b) by 54 days.

(21) Appl. No.: 17/066,049

(22) Filed: Oct. 8, 2020

(65) Prior Publication Data
US 2021/0375707 A1 Dec. 2, 2021

Related U.S. Application Data

(60) Provisional application No. 63/032,177, filed on May 29, 2020.

(51) Int. Cl.
*H01L 23/31* (2006.01)
*H01L 23/552* (2006.01)
(Continued)

(52) U.S. Cl.
CPC ........ *H01L 23/315* (2013.01); *H01L 21/4853* (2013.01); *H01L 21/565* (2013.01);
(Continued)

(58) Field of Classification Search
CPC . H01L 2924/15153; H01L 2924/19105; H01L 2924/181; H01L 2924/19103;
(Continued)

(56) References Cited

U.S. PATENT DOCUMENTS 6,181,015 B1 * 1/2001 Gotoh .................... H03H 9/059
257/E23.126
6,262,513 B1 * 7/2001 Furukawa ............ H03H 9/6436
257/E23.128

(Continued)

FOREIGN PATENT DOCUMENTS

WO 2019065977 A1 4/2019

OTHER PUBLICATIONS

International Search Report and Written Opinion—PCT/US2021/028468—ISA/EPO—Sep. 29, 2021.
(Continued)

*Primary Examiner* — Victor A Mandala
*Assistant Examiner* — Lawrence C Tynes, Jr.
(74) *Attorney, Agent, or Firm* — Loza & Loza, LLP

(57) ABSTRACT

A package that includes a substrate, an integrated device, a first encapsulation layer and a void. The substrate includes a first surface. The integrated device is coupled to the first surface of the substrate. The first encapsulation layer is located over the first surface of the substrate and the integrated device. The first encapsulation layer includes an undercut relative to a side surface of the integrated device. The void is located between the integrated device and the first surface of the substrate. The void is laterally surrounded by the undercut of the encapsulation layer.

33 Claims, 25 Drawing Sheets

SIDE PROFILE VIEW

(51) Int. Cl.
*H01L 23/00* (2006.01)
*H01L 21/48* (2006.01)
*H01L 21/56* (2006.01)
*H03H 9/64* (2006.01)

(52) U.S. Cl.
CPC ...... *H01L 23/3128* (2013.01); *H01L 23/3135* (2013.01); *H01L 23/552* (2013.01); *H01L 24/16* (2013.01); H01L 2224/16227 (2013.01); H01L 2924/1811 (2013.01); H01L 2924/3025 (2013.01); *H03H 9/64* (2013.01)

(58) Field of Classification Search
CPC . H01L 2924/10272; H01L 2924/10329; H01L 2924/1033; H01L 2924/12041; H01L 2924/1421; H01L 2924/1434; H01L 2924/3025; H01L 2924/18161; H01L 2924/19041; H01L 2924/19042; H01L 25/0652; H01L 25/0655; H01L 25/042; H01L 25/072; H01L 25/0753; H01L 25/115; H01L 25/0657; H01L 25/16; H01L 25/18; H01L 23/315; H01L 23/3135; H01L 23/552; H01L 23/3128; H01L 23/5383; H01L 21/565; H01L 21/56; H01L 2224/29011; H01L 2224/24145; H01L 2224/32145; H01L 2225/06537; H01L 2225/06572; H01L 2223/6677; H03H 9/64; B81C 1/00277–00293; B81C 1/00055–00087; B81B 2203/0315
See application file for complete search history.

(56) References Cited

U.S. PATENT DOCUMENTS

| | | | | |
|---|---|---|---|---|
| 6,417,026 B2* | 7/2002 | Gotoh | ............... | H03H 9/1092 |
| | | | | 438/126 |
| 6,492,194 B1* | 12/2002 | Bureau | ............... | H01L 23/3164 |
| | | | | 257/E23.114 |
| 6,663,943 B2* | 12/2003 | Kadota | ............... | H03H 9/1085 |
| | | | | 257/788 |
| 6,914,367 B2* | 7/2005 | Furukawa | ............... | H03H 9/1085 |
| | | | | 310/313 R |
| 7,474,175 B2* | 1/2009 | Furihata | ............... | H03H 9/1085 |
| | | | | 257/E23.125 |
| 7,727,806 B2* | 6/2010 | Uhland | ............... | B81C 1/0023 |
| | | | | 257/E21.511 |
| 8,076,827 B2* | 12/2011 | Saitou | ............... | H03H 9/1064 |
| | | | | 310/344 |
| 9,076,789 B2* | 7/2015 | Aiba | ............... | H01L 24/06 |
| 10,903,156 B2* | 1/2021 | Pahl | ............... | H01L 23/055 |
| 2002/0145180 A1* | 10/2002 | Terui | ............... | H01L 24/32 |
| | | | | 257/676 |
| 2003/0128522 A1* | 7/2003 | Takeda | ............... | H05K 1/0201 |
| | | | | 257/E23.105 |
| 2004/0125579 A1* | 7/2004 | Konishi | ............... | H01L 25/0652 |
| | | | | 257/E23.125 |
| 2004/0164390 A1* | 8/2004 | Wang | ............... | H01L 23/3128 |
| | | | | 257/E23.092 |
| 2004/0207059 A1* | 10/2004 | Hong | ............... | H01L 23/3135 |
| | | | | 257/E23.126 |
| 2004/0213973 A1* | 10/2004 | Hara | ............... | C09J 123/0869 |
| | | | | 156/298 |
| 2005/0288392 A1* | 12/2005 | Okubora | ............... | H05K 1/186 |
| | | | | 257/E21.511 |
| 2006/0103003 A1* | 5/2006 | Heide | ............... | H03H 9/1071 |
| | | | | 257/E23.128 |
| 2006/0145339 A1* | 7/2006 | Yang | ............... | H05K 1/183 |
| | | | | 257/E23.125 |
| 2007/0069371 A1* | 3/2007 | Iksan | ............... | H01L 23/3128 |
| | | | | 438/106 |
| 2007/0158829 A1* | 7/2007 | Hsu | ............... | H01L 23/13 |
| | | | | 257/E23.06 |
| 2008/0136002 A1* | 6/2008 | Yang | ............... | H01L 24/82 |
| | | | | 257/686 |
| 2008/0157316 A1* | 7/2008 | Yang | ............... | H01L 25/50 |
| | | | | 257/685 |
| 2008/0272858 A1* | 11/2008 | Furihata | ............... | H03H 9/02984 |
| | | | | 257/E23.125 |
| 2011/0140283 A1* | 6/2011 | Chandra | ............... | H01L 25/105 |
| | | | | 257/E23.141 |
| 2012/0228764 A1* | 9/2012 | Tseng | ............... | H01L 24/20 |
| | | | | 257/737 |
| 2014/0085850 A1* | 3/2014 | Li | ............... | H05K 1/0231 |
| | | | | 29/841 |
| 2015/0259194 A1* | 9/2015 | Lin | ............... | B81C 1/0023 |
| | | | | 257/773 |
| 2016/0013151 A1* | 1/2016 | Shen | ............... | H01L 23/5384 |
| | | | | 257/686 |
| 2016/0090294 A1* | 3/2016 | Wachter | ............... | H01L 24/97 |
| | | | | 438/51 |
| 2018/0026008 A1* | 1/2018 | Jeng | ............... | H01L 23/5389 |
| | | | | 257/692 |
| 2018/0151518 A1* | 5/2018 | Shen | ............... | H01L 23/3135 |
| 2018/0191327 A1* | 7/2018 | Chang | ............... | H03H 3/02 |
| 2018/0323170 A1* | 11/2018 | Kim | ............... | H01L 21/4853 |
| 2019/0074267 A1* | 3/2019 | Yang | ............... | H01L 25/50 |
| 2019/0131232 A1* | 5/2019 | Lee | ............... | H01L 25/0655 |
| 2019/0206824 A1* | 7/2019 | Lu | ............... | H01L 24/20 |
| 2020/0006235 A1* | 1/2020 | Aleksov | ............... | H01L 23/66 |
| 2020/0006305 A1* | 1/2020 | Lambert | ............... | H01L 24/16 |
| 2020/0020643 A1* | 1/2020 | Yu | ............... | H01L 23/49827 |
| 2020/0075501 A1* | 3/2020 | Raorane | ............... | H01L 25/0657 |
| 2020/0144235 A1* | 5/2020 | Kang | ............... | H01L 21/481 |
| 2020/0168558 A1* | 5/2020 | Seo | ............... | H01L 23/5384 |
| 2020/0273839 A1* | 8/2020 | Elsherbini | ............... | H01L 23/49822 |
| 2020/0312783 A1* | 10/2020 | Min | ............... | H01L 23/5389 |
| 2020/0321293 A1* | 10/2020 | Kim | ............... | H01Q 1/2283 |
| 2020/0373244 A1* | 11/2020 | Kang | ............... | H01L 23/552 |

OTHER PUBLICATIONS

Partial International Search Report—PCT/US2021/028468—ISA/EPO—Aug. 6, 2021.

* cited by examiner

FIG. 2  SIDE PROFILE VIEW

SIDE PROFILE VIEW

FIG. 6 SIDE PROFILE VIEW

SIDE PROFILE VIEW

SIDE PROFILE VIEW

SIDE PROFILE VIEW

SIDE PROFILE VIEW

PACKAGE COMPRISING A SUBSTRATE, AN INTEGRATED DEVICE, AND AN ENCAPSULATION LAYER WITH UNDERCUT

CROSS-REFERENCE/CLAIM OF PRIORITY TO RELATED APPLICATION

The present application claims priority to and the benefit of U.S. Provisional Application No. 63/032,177, filed on May 29, 2020, and titled, "PACKAGE COMPRISING A SUBSTRATE, AN INTEGRATED DEVICE, AND AN ENCAPSULATION LAYER WITH UNDERCUT", which is hereby expressly incorporated by reference.

FIELD

Various features relate to packages that include a substrate and an integrated device, but more specifically to a package that includes a substrate, an integrated device, and an encapsulation layer.

BACKGROUND

FIG. 1 illustrates a package 100 that includes a substrate 102 and an integrated device 104. The integrated device 104 is coupled to a first surface of the substrate 102 through a plurality of solder interconnects 140. The substrate 102 includes at least one dielectric layer 120, a plurality of interconnects 121, a first solder resist layer 124, and a second solder resist layer 126. A plurality of solder interconnects 130 is coupled to a second surface of the substrate 102. The package 100 also includes an encapsulation layer 160 that encapsulates the integrated device 104. The process of forming the encapsulation layer 160 may cause at least part of the encapsulation layer 160 to flow underneath the integrated device 104, and form between the integrated device 104 and the substrate 102. For certain types of integrated devices, having the encapsulation layer 160 between the integrated device 104 and the substrate 102 may limit and/or impair the performance of the integrated device 104 and/or the package 100.

There is an ongoing need to improve the performance of packages and integrated devices located in a package.

SUMMARY

Various features relate to packages that include a substrate and an integrated device, but more specifically to a package that includes a substrate, an integrated device, and an encapsulation layer.

One example provides a package that includes a substrate, an integrated device, a first encapsulation layer and a void. The substrate includes a first surface. The integrated device is coupled to the first surface of the substrate. The first encapsulation layer is located over the first surface of the substrate and the integrated device. The first encapsulation layer includes an undercut relative to a side surface of the integrated device. The void is located between the integrated device and the first surface of the substrate. The void is laterally surrounded by the undercut of the encapsulation layer.

Another example provides an apparatus that includes a substrate, an integrated device, means for first encapsulation and a void. The substrate includes a first surface. The integrated device is coupled to the first surface of the substrate. The means for first encapsulation is located over the first surface of the substrate and the integrated device. The means for first encapsulation includes an undercut relative to a side surface of the integrated device. The void is located between the integrated device and the first surface of the substrate. The void is laterally surrounded by the undercut of the means for first encapsulation.

Another example provides a method for fabricating a package. The method provides a substrate comprising a first surface. The method couples an integrated device to the first surface of the substrate. The method forms a first encapsulation layer over the first surface of the substrate and the integrated device. The first encapsulation layer includes an undercut relative to a side surface of the integrated device. Forming the first encapsulation layer forms a void located between the integrated device and the first surface of the substrate, where the void is laterally surrounded by the undercut of the first encapsulation layer.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate, an integrated device, a first encapsulation layer and a void. The substrate includes a first surface. The integrated device is coupled to the first surface of the substrate. The first encapsulation layer is located over the first surface of the substrate and the integrated device. The first encapsulation layer includes an undercut relative to a side surface of the integrated device. The first encapsulation layer may have a uniform thickness over a top surface and the side surface of the integrated device. The void is located between the integrated device and the first surface of the substrate. The void is laterally surrounded by the undercut of the first encapsulation layer. A second encapsulation layer may be formed and located over the first encapsulation layer. The package may be free of a foil (e.g., adhesive foil, glue foil) and/or a sealing film between the integrated device and the first encapsulation layer, which helps reduce fabrication costs for the package. The use of the first encapsulation layer and the second encapsulation layer may help provide a package with an encapsulation layer with controlled undercut, which allows for more accurate and precise control of the void between an integrated device and the substrate. The integrated device may be configured as a filter. Moreover, the materials used for the substrate and the encapsulation layer(s) may be chosen so that a coefficient of thermal expansion (CTE) mismatch between the substrate and the rest of the package is minimized, thereby providing a more robust and reliable package.

Figure 1:
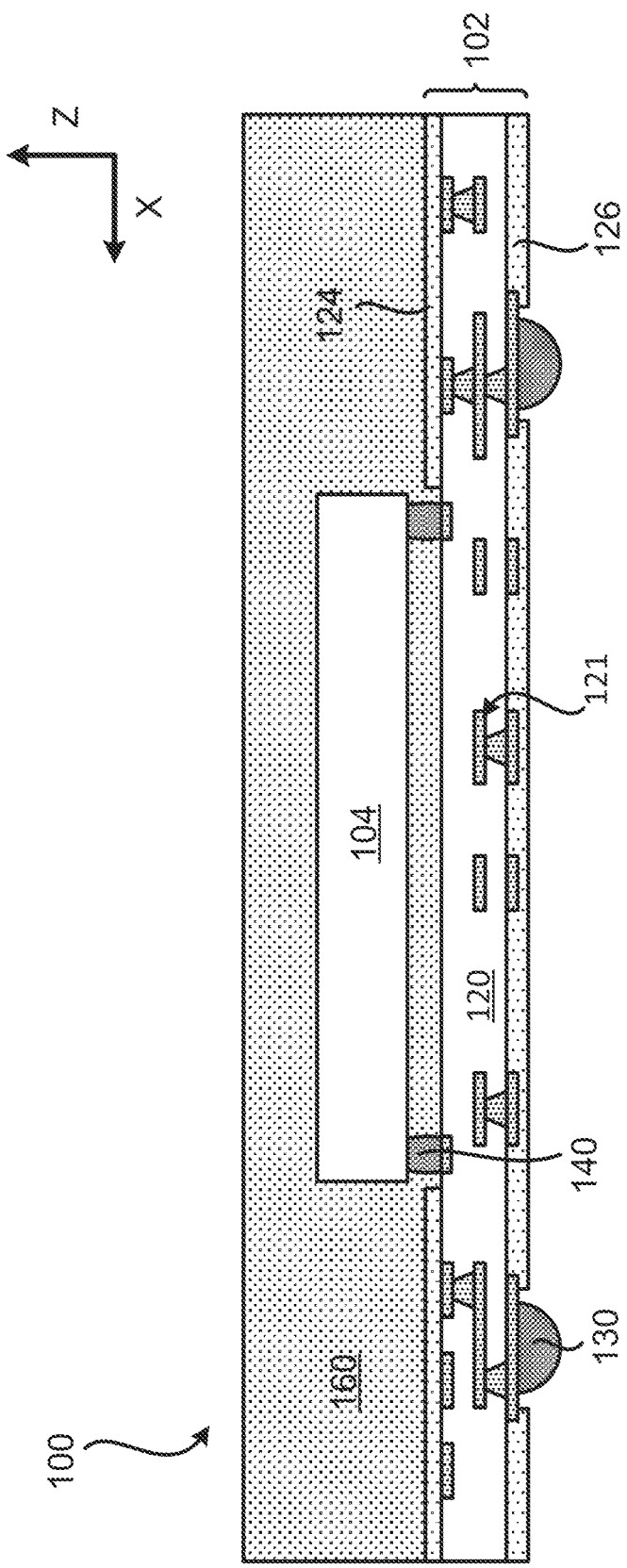
FIG. 1 illustrates a profile view of a package that includes a substrate and an integrated device.
Figure 2:
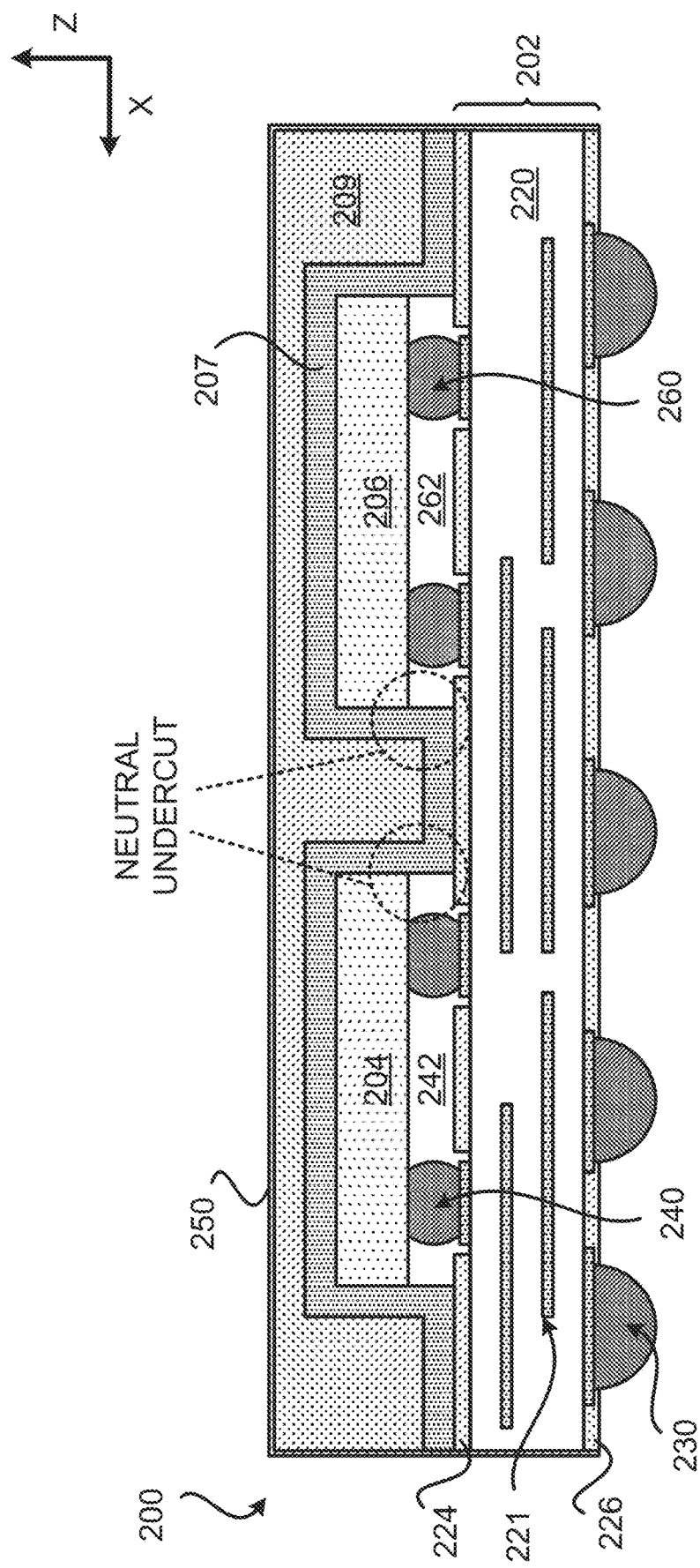
FIG. 2 illustrates a profile view of a package that includes a substrate, an integrated device, and an encapsulation layer with controlled undercut.

Exemplary Package Comprising a Substrate, an Integrated Device and an Encapsulation Layer with Controlled Undercut FIG. 2 illustrates a profile view of a package 200 that includes a substrate 202, an integrated device 204, an integrated device 206, an encapsulation layer 207, an encapsulation layer 209 and an electromagnetic interference (EMI) shield 250. In some implementations, the package 200 may be an integrated circuit (IC) package, such as a system in package (SiP) or a chip scale package (CSP). In some implementations, the package 200 may be configured as a radio frequency front end (RFFE) package that includes a radio frequency (RF) filter.

The substrate 202 includes at least one dielectric layer 220, a plurality of interconnects 221 (e.g., trace, pad, via), a solder resist layer 224 and a solder resist layer 226. The solder resist layer 224 may be formed and located over a first surface of the at least one dielectric layer 220. The solder resist layer 226 may be formed and located over a second surface of the at least one dielectric layer 220. The substrate 202 may be a coreless substrate, a laminate substrate, or a substrate that includes a core layer. The at least one dielectric layer 220 may include different materials, such as prepreg layer, a polyimide (e.g., photo-etchable dielectric layer), an organic layer, and/or a ceramic. A plurality of solder interconnects 230 is coupled to the plurality of interconnects 221 through a second surface (e.g., bottom surface) of the substrate 202.

The integrated device 204 is coupled to a first surface (e.g., top surface) of the substrate 202 through a plurality of solder interconnects 240. A void 242 is located between the integrated device 204 and the first surface of the substrate 202. The integrated device 206 is coupled to the first surface (e.g., top surface) of the substrate 202 through a plurality of solder interconnects 260. A void 262 is located between the integrated device 206 and the first surface of the substrate 202. A void (e.g., 242, 262) may be at least one region that is free of a solid material. A void may include a cavity. A void may be occupied by a gas (e.g., air).

An integrated device (e.g., 204, 206) may include a die (e.g., semiconductor bare die). The integrated device may include a radio frequency (RF) device, a passive device, a filter, a capacitor, an inductor, an antenna, a transmitter, a receiver, a surface acoustic wave (SAW) filter, a bulk acoustic wave (BAW) filter, a light emitting diode (LED) integrated device, a silicon carbide (SiC) based integrated device, a GaAs based integrated device, a GaN based integrated device, a processor, memory and/or combinations thereof. An integrated device (e.g., 204, 206) may include at least one electronic circuit (e.g., first electronic circuit, second electronic circuit, etc. . . . ).

For example, when the integrated device (e.g., 204, 206) is configured as a semiconductor integrated circuit die, the integrated device may include a substrate and a device layer that includes transistors configured to perform operations (e.g., logic operations). In another example, when the integrated device (e.g., 204, 206) is configured as a bare die filter (e.g., SAW filter, BAW filter), the integrated device may include a piezoelectric substrate and at least one metal layer formed and located over the piezoelectric substrate, that is configured as at least one transducer (e.g., interdigital transducer (IDT)). Examples of a bare die filter are further illustrated and described below in at least FIGS. 11, 12, 16A-16B and 17A-17B. When the integrated device is configured as a filter, a void between the integrated device and the substrate may help improve the performance of the integrated device configured as a filter.

FIG. 2 illustrates the encapsulation layer 207 is coupled to, formed and located over the first surface of the substrate 202, the integrated device 204 and the integrated device 206 such that (i) the void 242 is located between the integrated device 204 and the substrate 202, and (ii) the void 262 is located between the integrated device 206 and the substrate 202. FIG. 2 illustrates that the encapsulation layer 207 has a neutral undercut with the side wall or side surface with the integrated devices. An undercut of an encapsulation layer describes (and/or quantifies) the location of an encapsulation layer (or portion of the encapsulation layer) relative to a void underneath a component (e.g., integrated device) and to another point of reference (e.g., vertical line aligned with a side wall or side surface of an integrated device). An undercut of an encapsulation layer may describe and/or quantify how far in the void underneath the integrated device is the encapsulation layer located or how far away from the void underneath the integrated device is the encapsulation layer located. A neutral undercut may mean that the encapsulation layer 207 may be vertically aligned with the side wall or side surface of the integrated devices (e.g., 204, 206) that is located over a void. However, as will be further described below in at least FIGS. 3 and 4, the encapsulation layer 207 may have a positive undercut or a negative undercut with an integrated device. The undercut value for the encapsulation layer may be in a range between approximately −20 micrometers (µm) and 50 micrometers (µm). A negative undercut value may mean that the encapsulation layer is located away from an integrated device and away from an imaginary line (or reference) that extends vertically from the side surface or side wall of the integrated device. A positive undercut value may mean that the encapsulation layer is located underneath an integrated device, towards a void underneath the integrated device, and away from an imaginary line that extends vertically from the side surface or side wall of the integrated device located over the void. However, a positive undercut and a negative undercut may be defined differently. The values for the undercut may represent a maximum undercut value (e.g., how far away from the imaginary line (or reference) is the most distant portion of the encapsulation layer). For an integrated device that has multiple sides, there may be a corresponding undercut for each side of the integrated device. That is, an encapsulation layer may have an undercut value for each side of the integrated device. The undercut value for each side of the integrated device may be different or the same. In some implementations, there may be variable undercut values for at least one side of the integrated device.

As shown in FIG. 2, each void underneath a respective integrated device is laterally surrounded by a respective undercut of the encapsulation layer 207 defined by the respective integrated device. For example, the void 242 is laterally surrounded by at least one undercut of the encapsulation layer 207 that is defined by the side surface of the integrated device 204. Similarly, the void 262 is laterally surrounded by at least one undercut of the encapsulation layer 207 that is defined by the side surface of the integrated device 206.

The present disclosure describes a package with accurately and precisely controlled undercut for an encapsulation layer near at least one void located between an integrated device and a substrate, which may lead to better performance from the integrated device and/or the package, since the region between the integrated device and the substrate is not obstructed by an encapsulation layer.

The encapsulation layer 207 may be a first encapsulation layer (e.g., means for first encapsulation). The encapsulation layer 207 may include a mold, a resin and/or an epoxy. The encapsulation layer 207 may include an isotropic material and/or an anisotropic material. As will be further described below, a sheet molding process (e.g., vacuum lamination, compression molding) may be used to form the encapsulation layer 207.

The encapsulation layer 207 is formed over the substrate 202, the integrated device 204 and the integrated device 206 such that the encapsulation layer 207 has an approximately uniform thickness, as the encapsulation layer 207 approximately follows the contour of the substrate 202, the integrated device 204 and/or the integrated device 206. The first encapsulation layer 207 may have a uniform thickness over a top surface and/or the side surface of the integrated device 204, and/or a uniform thickness over a top surface and/or the side surface of the integrated device 206. In some implementations, the first encapsulation layer 207 may have a thickness over the side surface of the integrated device(s) 204 and/or 207 that is thinner than a thickness over the top surface of the integrated device(s) 204 and/or 207. It is noted that uniform thickness does not necessarily mean that the encapsulation layer has exactly the same thickness everywhere. A uniform thickness as used in the disclosure, means that the thickness of a component (e.g., encapsulation layer) is approximately the same within a certain tolerance. For example, a uniform thickness may mean that the thickness is the same within a certain percentage of the average thickness of the material. For example, if the encapsulation layer 207 has an average thickness (Tavg), then the encapsulation layer 207 may be considered to have a uniform thickness if the thickness at any portion of the encapsulation layer 207 is within 10 percent or less (e.g., 5 percent or less) of the average thickness (Tavg) of the encapsulation layer 207. In another example, a component (e.g., encapsulation layer) may have a uniform thickness when the difference between the thickest portion of the component (e.g., encapsulation layer) and the thinnest portion of the component (e.g., encapsulation layer) is 16 micrometers (µm) or less. In some implementations, the encapsulation layer 207 may have thickness of approximately 80 micrometers (µm)±8 micrometers (µm). However, different implementations may use an encapsulation layer 207 with a different uniform thickness. The uniform thickness of the encapsulation layer 207 may be applicable to portions of the encapsulation layer 207 that are touching a surface of a component (e.g., integrated device, substrate). In some implementations, the uniformity of the encapsulation layer 207 may not be applicable to portions of the encapsulation layer 207 adjacent to a void. The sheet molding process may allow for accurate and precise control of the undercut for the encapsulation layer 207 near an integrated device located over a void, which in turns allows for accurate and precise control of the voids (e.g., 242, 262) between an integrated device and a substrate.

The encapsulation layer 207 may be provided and formed without the need of a foil and/or a sealing film that follows the contours of the substrate 202, the integrated device 204 and the integrated device 206. This may be done by using a sheet mold of the encapsulation layer 207 that has a low viscosity value, so that the encapsulation layer 207 does not flow substantially underneath the integrated device(s). For example, for a temperature range between 60° C.-140° C., the viscosity values for the encapsulation layer 207 may be between 0.01-100 mPa·s (milliPascal second). Thus, FIG. 2 and other figures in the disclosure, illustrate a package that is free of a sealing film between the encapsulation layer 207 and the substrate 202, the integrated device 204 and the integrated device 206. One advantage of the foil free package or sealing film free package, is a package that is cheaper to fabricate due to fact that this requires at least one less step and at least one less material.

The encapsulation layer 209 is coupled to, formed and located over the encapsulation layer 207. The encapsulation layer 209 may be a second encapsulation layer (e.g., means for second encapsulation). The encapsulation layer 209 may include a mold, a resin and/or an epoxy. The encapsulation layer 209 may include an isotropic material and/or an anisotropic material. The encapsulation layer 209 may include a different material from the encapsulation layer 207. The encapsulation layer 209 may have at least one different property than the encapsulation layer 207. For example, the encapsulation layer 209 may have a different coefficient of thermal expansion (CTE) than the encapsulation layer 207. In some implementations, the encapsulation layer 209 may have a CTE (e.g., 33 part per million (ppm)) that is higher/greater than the CTE (e.g., 10 ppm) of the encapsulation layer 207. In some implementations, the encapsulation layer 209 may have a CTE that is less/lower than the CTE of the encapsulation layer 207. A compression molding process, a transfer molding process, or a liquid molding process may be used to form the encapsulation layer 209. The encapsulation layer 209 may be photo etchable. There may be a boundary interface between the encapsulation layer 209 and the encapsulation layer 207. Moreover, in addition to molding processes, the encapsulation layer 209 may be laminated together with the encapsulation layer 207 to create a single sheet. This single sheet comprising the encapsulation layer 207 and the encapsulation layer 209 may be applied to the substrate 202, the integrated device 204 and the integrated device 206 via vacuum lamination or compression molding.

The EMI shield 250 may be coupled to, formed and located over the encapsulation layer 209 and the side portion of the substrate 202. The EMI shield 250 may include a conductive layer. The EMI shield 250 may be configured to be coupled to ground. For example, the EMI shield 250 may be configured to be electrically coupled to a ground interconnect (e.g., ground interconnect from the substrate 202). The EMI shield 250 may be a means for electromagnetic interference (EMI) shielding.

To increase and improve the reliability of the package 200 (or any of the packages described in the disclosure), the design of the various components of the package 200 may be chosen so that the maximum CTE mismatch between the substrate 202 and the rest of the package 200 is 15 parts per million/Kelvin (ppm/K) or less. For example, the maximum difference between the effective CTE (e.g., substrate CTE) of the substrate 202 and the effective and collective CTE of the integrated device(s) (e.g., 204, 206), the solder interconnects (e.g., 240, 260) coupling the integrated device(s), the encapsulation layer 207, the encapsulation layer 209 and/or the EMI shield 250, may be approximately 15 ppm/K or less. Thus, the substrate 202 may have a substrate CTE that is within 15 ppm/K of an effective CTE of the rest of the package 200. The substrate CTE of the substrate 202 may represent the effective and collective CTE of the at least one dielectric layer 220, the plurality of interconnects 221, the solder resist layer 224, and/or the solder resist layer 226. In some implementations, the substrate CTE of the substrate 202 may be in a range of approximately 5-20 parts per million/Kelvin (ppm/K).

Figure 3:
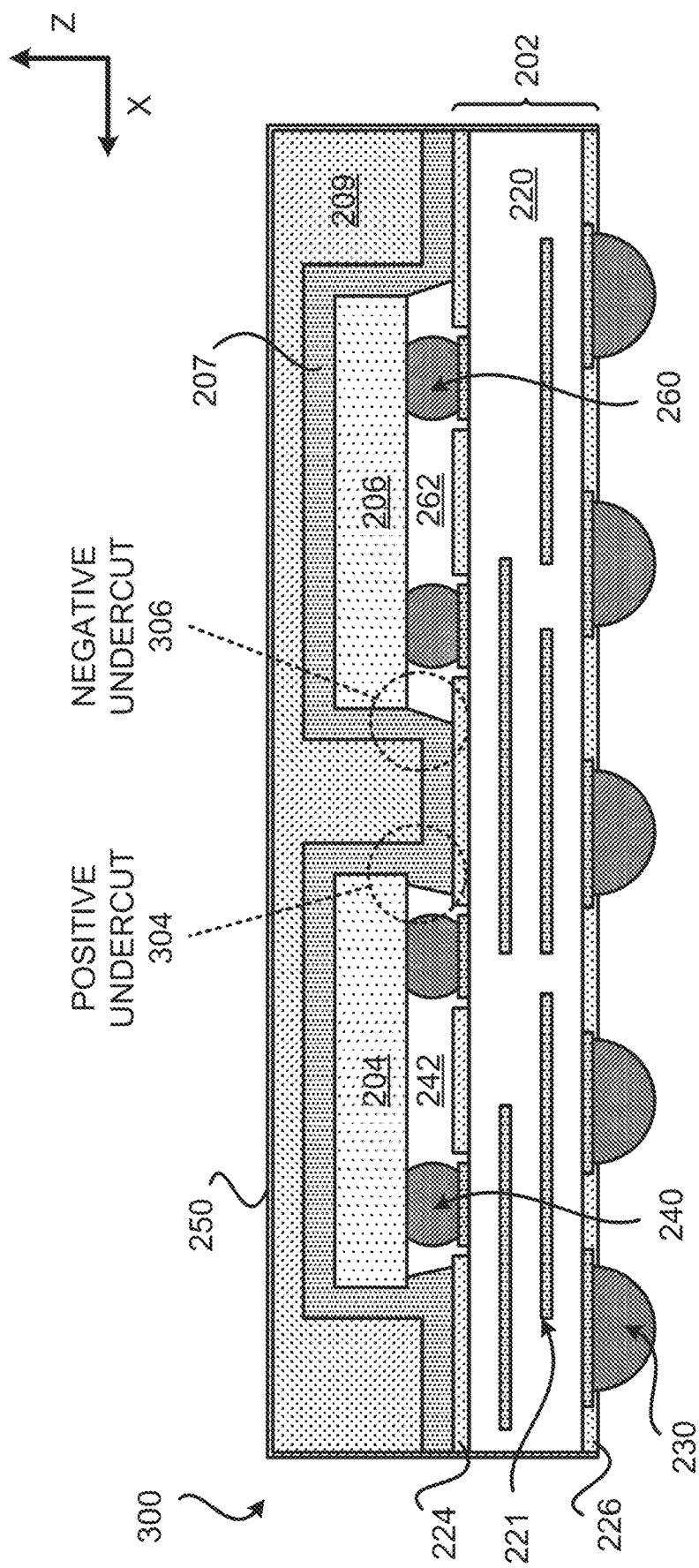
FIG. 3 illustrates a profile view of a package that includes a substrate, an integrated device, and an encapsulation layer with controlled undercut.
Figure 4:
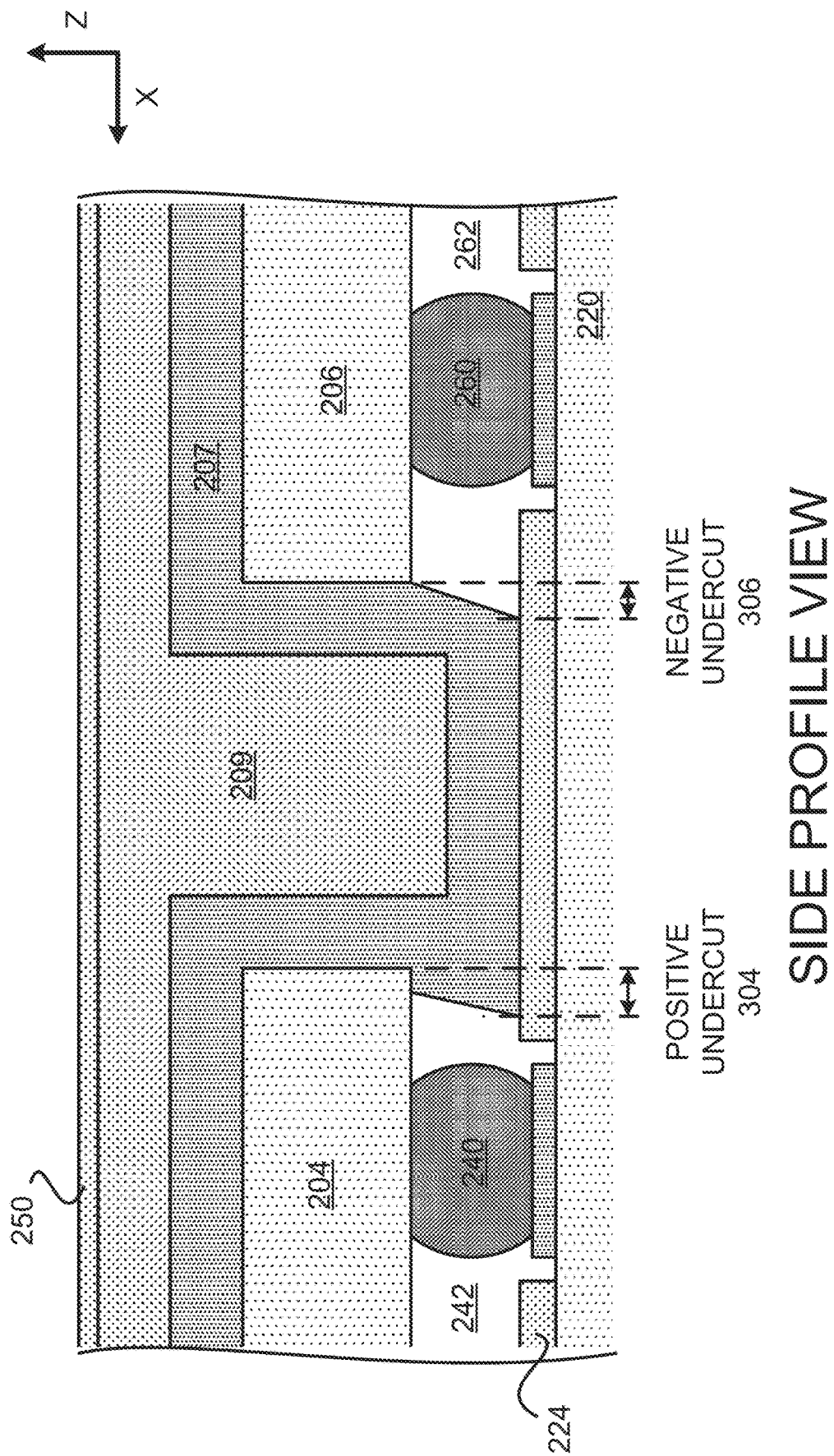
FIG. 4 illustrates a close-up view of a package that includes a substrate, an integrated device, and an encapsulation layer with controlled undercut.

FIG. 3 illustrates a package 300 that includes an encapsulation layer that includes a positive undercut and a negative undercut. The package 300 is similar to the package 200 of FIG. 2, and includes similar or the same components as the package 200. FIG. 3 illustrates that the encapsulation layer 207 includes a positive undercut 304 and a negative undercut 306. FIG. 4 illustrates a close view of the package 300. As shown in FIG. 4, the encapsulation layer 207 may be formed such that the encapsulation layer 207 has a positive undercut 304 relative to the integrated device 204 and the void 242, and a negative undercut relative to the integrated device 206 and the void 262. However, it is noted that encapsulation layer 207 may have a positive undercut, a neutral undercut, and/or a negative undercut with an integrated device. For example, the encapsulation layer 207 may have a positive undercut with one side of the integrated device, and may have a negative undercut with another side of the integrated device. In some implementations, the encapsulation layer 207 may have variable undercut with an integrated device. In some implementations, one side of the encapsulation layer 207 may have a positive undercut, a neutral undercut and/or a negative undercut. As mentioned above, the undercut value for the encapsulation layer 207 near an integrated device located over a void, may be in a range of −20-50 micrometers (μm) (e.g., range between negative 20 μm and positive 50 μm). Thus, the encapsulation layer 207 may have a negative undercut, a neutral undercut, a positive undercut, or combinations thereof, with at least one integrated device (e.g., 204, 206). The values for the undercut may represent maximum undercut values (e.g., how far away from the imaginary line is the most distant portion of the encapsulation layer). At least a portion of the encapsulation layer 207 may have a uniform thickness, as described in FIG. 2.

Figure 5:
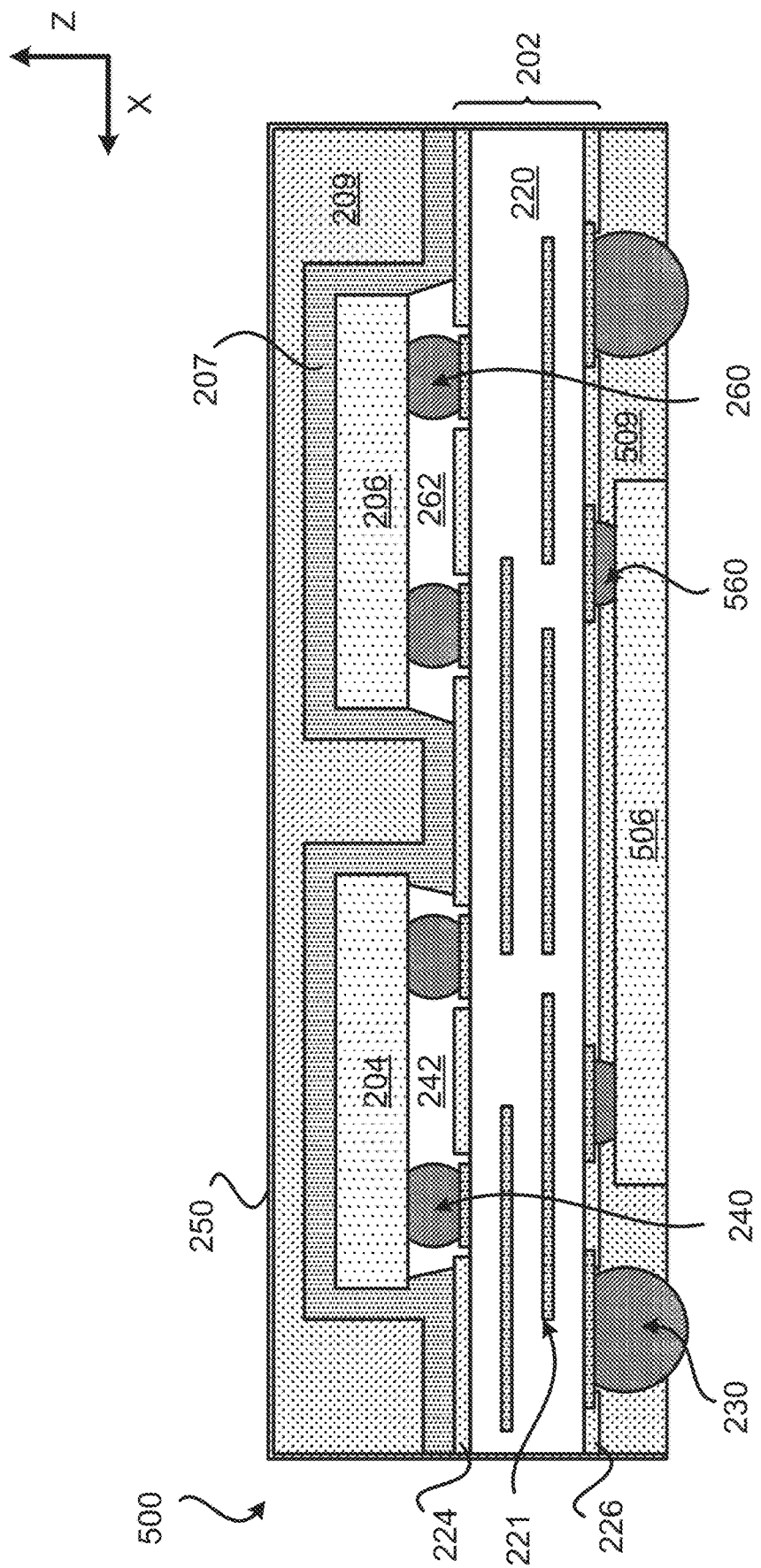
FIG. 5 illustrates a profile view of another package that includes a substrate, an integrated device, and an encapsulation layer with controlled undercut.

FIG. 5 illustrates a package 500 that includes an encapsulation layer with various undercuts. The package 500 is similar to the package 300 of FIG. 3, and includes similar or the same components as the package 300. The package 500 also includes an integrated device 506, an encapsulation layer 509, and a plurality of solder interconnects 560. The integrated device 506 is coupled to the second surface (e.g., bottom surface) of the substrate 202 through the plurality of solder interconnects 560. The encapsulation layer 509 is located over and coupled to the second surface of the substrate 202. The encapsulation layer 509 encapsulates the integrated device 506 and portions of the plurality of solder interconnects 230. The encapsulation layer 509 may be similar to the encapsulation layer 207 and/or the encapsulation layer 209. The encapsulation layer 509 may be a third encapsulation layer (e.g., means for third encapsulation). The encapsulation layer 509 may include a mold, a resin and/or an epoxy. A compression molding process, a transfer molding process, or a liquid molding process may be used to form the encapsulation layer 509. The encapsulation layer 509 may be photo etchable.

The effective collective CTE of the integrated device 506, the encapsulation layer 509, the plurality of solder interconnects 560 and the plurality of the solder interconnects 230 may be chosen so that the maximum CTE mismatch with the substrate 202 is 15 ppm/K or less. At least a portion of the encapsulation layer 207 may have a uniform thickness, as described in FIG. 2.

Figure 6:
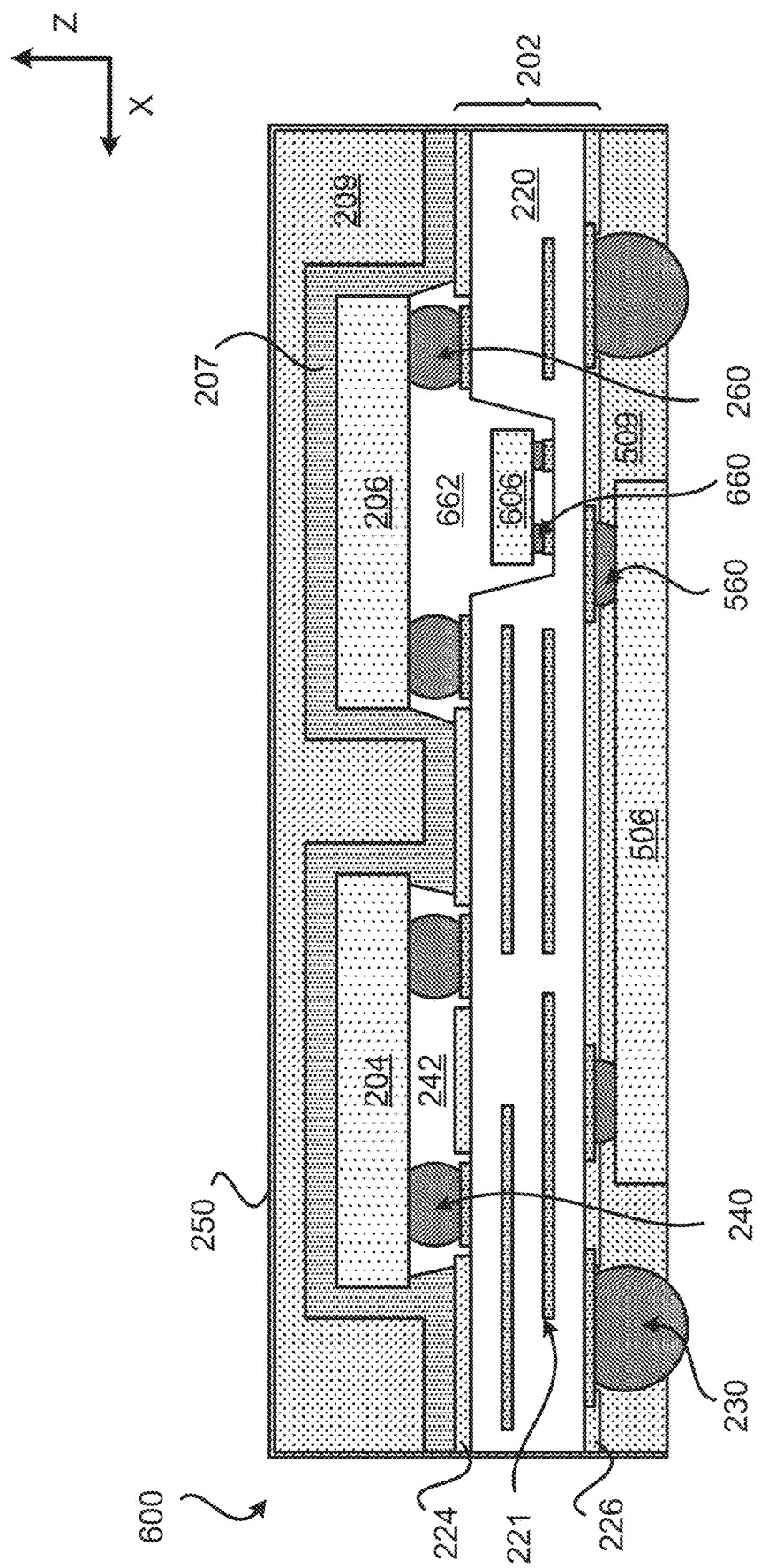
FIG. 6 illustrates a profile view of another package that includes a substrate, an integrated device, and an encapsulation layer with controlled undercut.

FIG. 6 illustrates a package 600 that includes an encapsulation layer that includes various undercuts. The package 600 is similar to the package 500 of FIG. 5, and includes similar or the same components as the package 500. The package 600 also includes an integrated device 606, a void 662 and a substrate 202 that includes a cavity. The void 662 is located between the integrated device 206 and the substrate 202. The void 662 may include a cavity located in the substrate 202. The integrated device 606 is located in the cavity of the substrate 202. The integrated device 606 is coupled to the substrate 202 through the plurality of solder interconnects 660. The back side of the integrated device 606 faces the front side of the integrated device 206. Similar to the other packages in the disclosure, the encapsulation layer 207 may have an undercut value in a range of −20-50 micrometers (μm) for various integrated devices located over a void. The undercut value(s) of the encapsulation layer 207 for an integrated device (e.g., 204, 206) over a void may be variable. At least a portion of the encapsulation layer 207 may have a uniform thickness, as described in FIG. 2.

Figure 7:
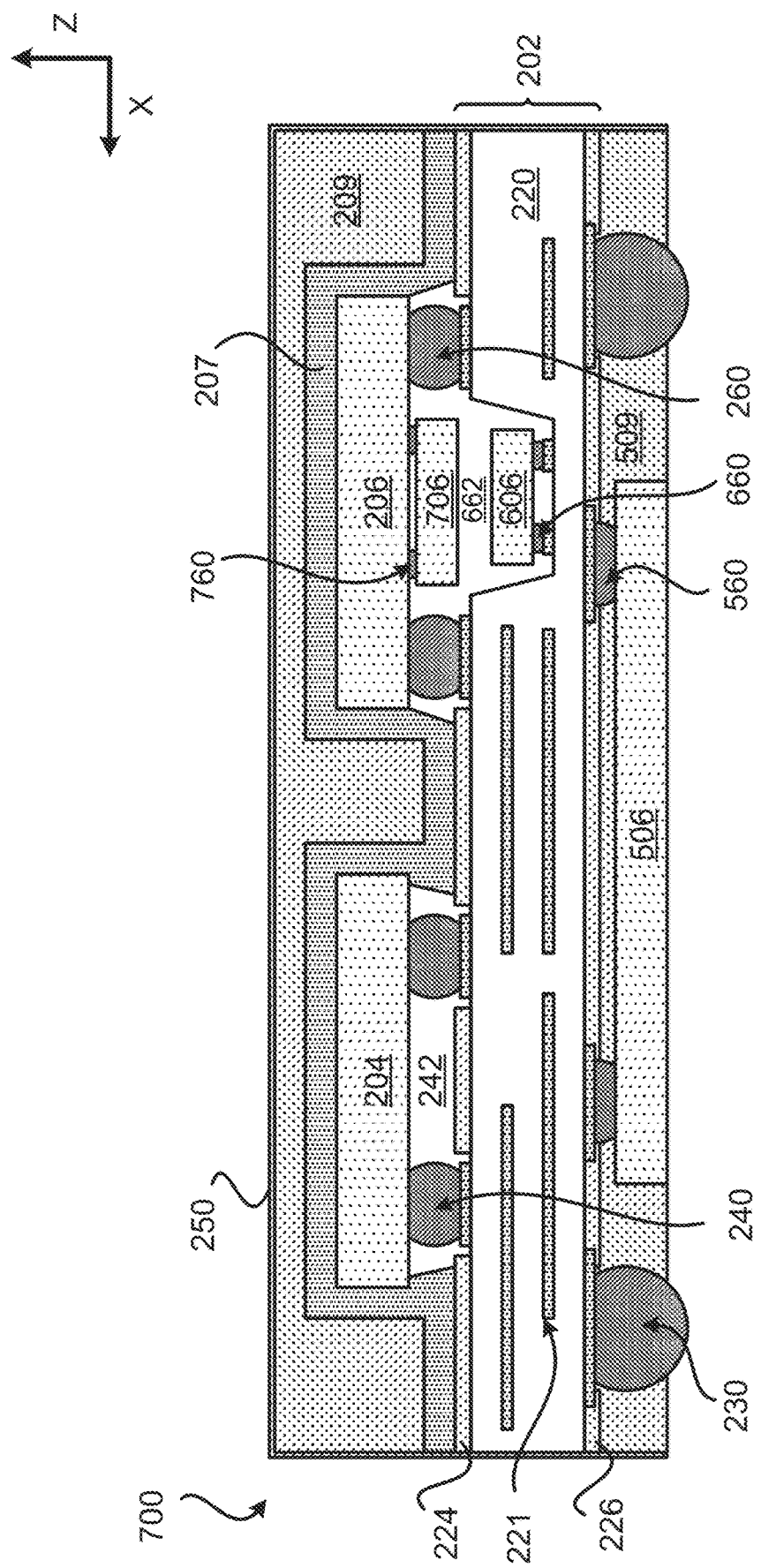
FIG. 7 illustrates a profile view of another package that includes a substrate, an integrated device, and an encapsulation layer with controlled undercut.

FIG. 7 illustrates a package 700 that includes an encapsulation layer that includes various undercuts. The package 700 is similar to the package 600 of FIG. 6, and includes similar or the same components as the package 600. The package 700 includes an integrated device 706, the integrated device 606, the void 662 and a substrate 202 that includes a cavity. The integrated device 706 is located in the void 662. The integrated device 706 is coupled to the integrated device 206 (e.g., in a front to front configuration). The back side of the integrated device 606 faces the back side of the integrated device 706. Similar to the other packages in the disclosure, the encapsulation layer 207 may have an undercut value in a range of −20-50 micrometers (μm) for various integrated devices located over a void. The undercut value(s) of the encapsulation layer 207 for an integrated device may be variable. At least a portion of the encapsulation layer 207 may have a uniform thickness, as described in FIG. 2.

Figure 8:
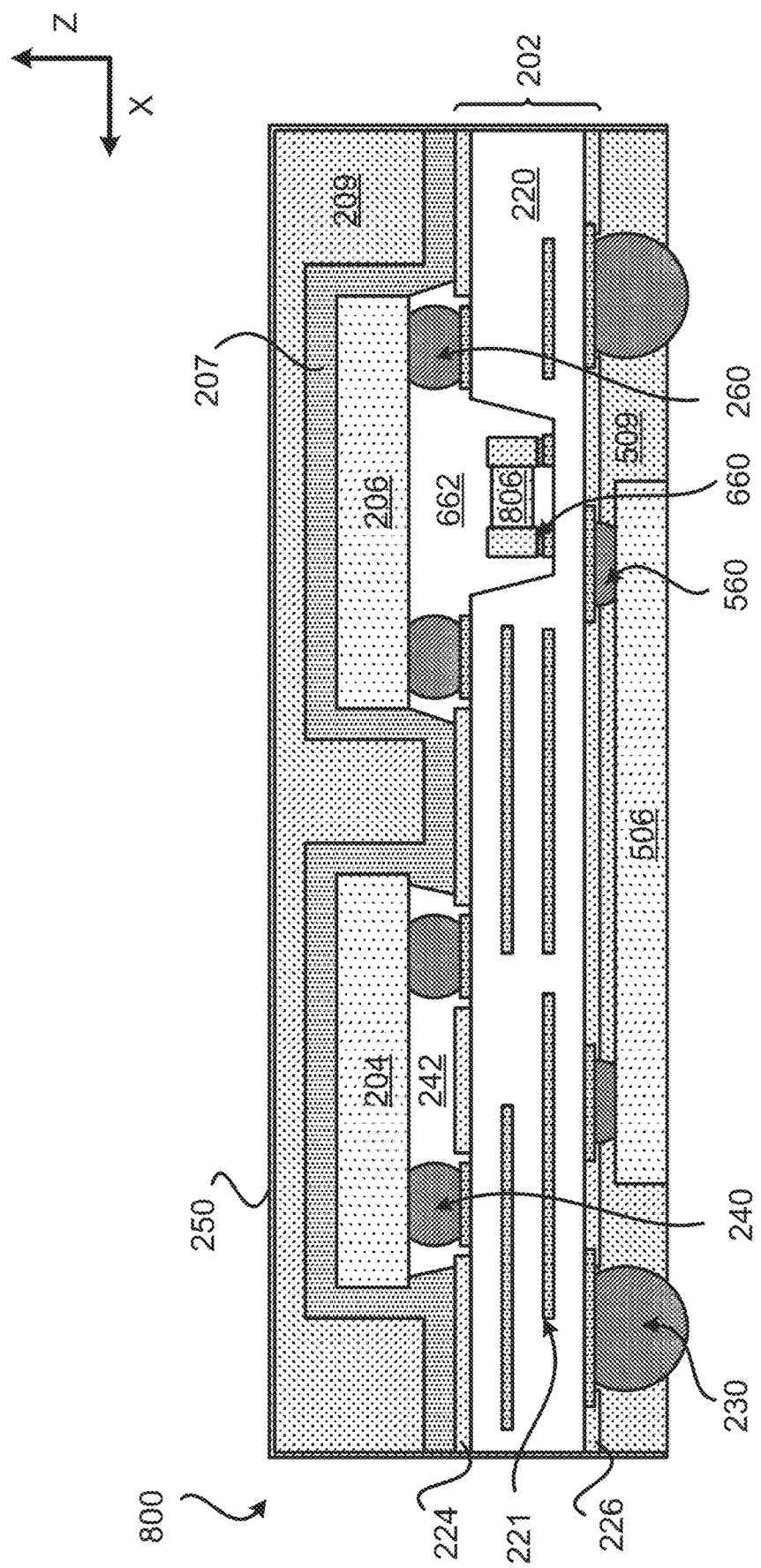
FIG. 8 illustrates a profile view of another package that includes a substrate, an integrated device, and an encapsulation layer with controlled undercut.

FIG. 8 illustrates a package 800 that includes an encapsulation layer that includes various undercuts. The package 800 is similar to the package 600 of FIG. 6, and includes similar or the same components as the package 600. The package 800 includes a passive device 806, the void 662 and a substrate 202 that includes a cavity. The void 662 is located between the integrated device 206 and the substrate 202. The void 662 may include a cavity located in the substrate 202. The passive device 806 is located in the cavity of the substrate 202. The passive device 806 is coupled to the substrate 202 through the plurality of solder interconnects 660. The passive device 806 may be a capacitor (e.g., surface mounted capacitor). Similar to the other packages in the disclosure, the encapsulation layer 207 may have an undercut value in a range of −20-50 micrometers (μm) for various integrated devices located over a void. The undercut value(s) of the encapsulation layer 207 for an integrated device may be variable. At least a portion of the encapsulation layer 207 may have a uniform thickness, as described in FIG. 2.

Figure 9:
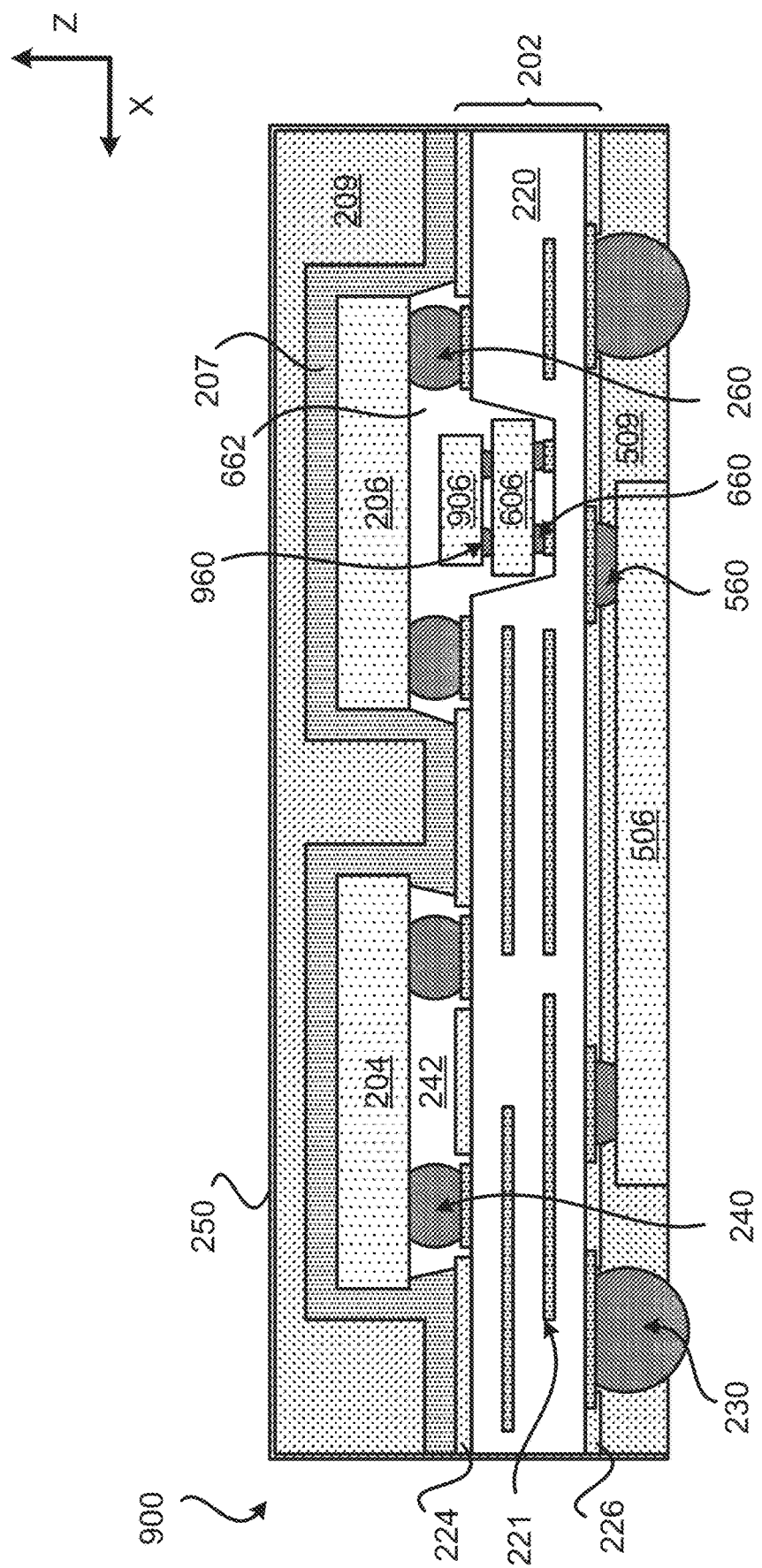
FIG. 9 illustrates a profile view of another package that includes a substrate, an integrated device, and an encapsulation layer with controlled undercut.

FIG. 9 illustrates a package 900 that includes an encapsulation layer that includes various undercuts. The package 900 is similar to the package 600 of FIG. 6, and includes similar or the same components as the package 600. The package 900 includes an integrated device 906, the integrated device 606, the void 662 and a substrate 202 that includes a cavity. The integrated device 906 is located in the void 662. The integrated device 906 is coupled to the integrated device 606 (e.g., in a front to back configuration) through the plurality of solder interconnects 960. The back side of the integrated device 906 faces the front side of the integrated device 206. Similar to the other packages in the disclosure, the encapsulation layer 207 may have an undercut value in a range of −20-50 micrometers (μm) for various integrated devices located over a void. The undercut value(s) of the encapsulation layer 207 for an integrated device may be variable. At least a portion of the encapsulation layer 207 may have a uniform thickness, as described in FIG. 2.

Figure 10:
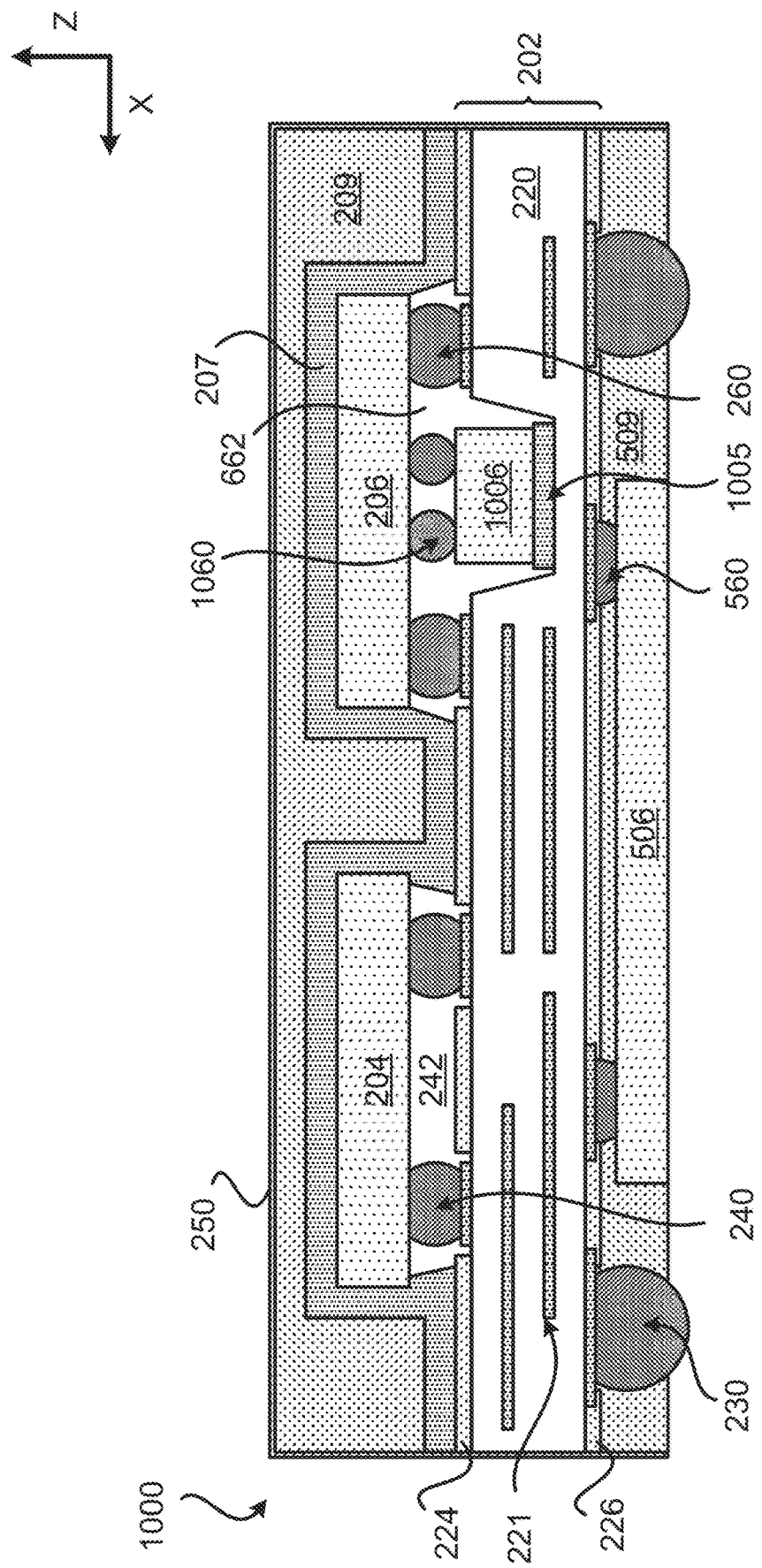
FIG. 10 illustrates a profile view of another package that includes a substrate, an integrated device, and an encapsulation layer with controlled undercut.

FIG. 10 illustrates a package 1000 that includes an encapsulation layer that includes various undercuts. The package 1000 is similar to the package 600 of FIG. 6, and includes similar or the same components as the package 600. The package 1000 includes an integrated device 1006, the void 662 and a substrate 202 that includes a cavity. The integrated device 1006 is located in the void 662. The integrated device 1006 is coupled to the integrated device 206 (e.g., in a front to front configuration) through the plurality of solder interconnects 1060. The back side of the integrated device 1006 is coupled to the substrate 202 through an adhesive 1005. Similar to the other packages in the disclosure, the encapsulation layer 207 may have an undercut value in a range of −20-50 micrometers (μm) for various integrated devices located over a void. The undercut value(s) of the encapsulation layer 207 for an integrated device may be variable. At least a portion of the encapsulation layer 207 may have a uniform thickness, as described in FIG. 2.

Figure 11:
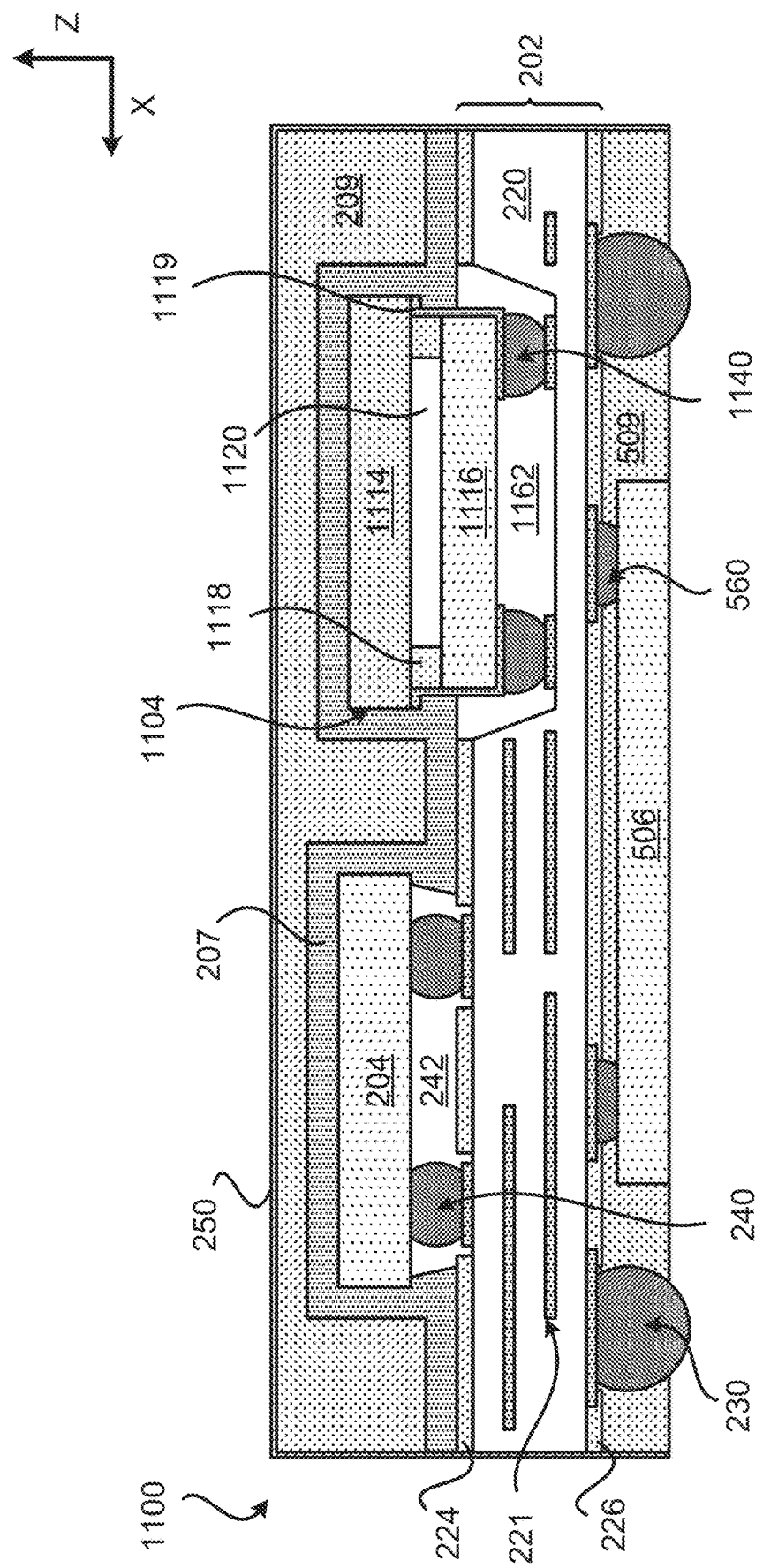
FIG. 11 illustrates a profile view of another package that includes a substrate, a stacked device, and an encapsulation layer with controlled undercut.

FIG. 11 illustrates a package 1100 that includes an encapsulation layer that includes various undercuts. The package 1100 is similar to the package 600 of FIG. 6, and includes similar or the same components as the package 600. The package 1100 includes a stacked device 1104, a void 1162 and a substrate 202 that includes a cavity. The stacked device 1104 may include stacked filters. The stacked device 1104 includes a first integrated device 1114 configured as a first filter (e.g., means for first signal filtering), a second integrated device 1116 configured as a second filter (e.g., means for second signal filtering), a polymer frame 1118 and a plurality of interconnects 1119. The first integrated device 1114 may be a top filter and the second integrated device 1116 may be a bottom filter. The first integrated device 1114 is coupled to a first surface of the polymer frame 1118. The second integrated device 1116 is coupled to a second surface of the polymer frame 1118. A void 1120 may be located between the first integrated device 1114, the second integrated device 1116 and the polymer frame 1118. The plurality of interconnects 1119 may be located over surfaces of the first integrated device 1114, the polymer frame 1118 and the second integrated device 1116. The stacked device 1104 is coupled to the substrate 202 through the plurality of solder interconnects 1140. At least part of the stacked device 1104 is located in the cavity of the substrate 202. The void 1162 includes the cavity of the substrate 202.

The encapsulation layer 207 is formed over the substrate 202, the integrated device 204 and the stacked device 1104 such that the encapsulation layer 207 has an approximately uniform thickness, as the encapsulation layer 207 approximately follows the contour of the substrate 202, the integrated device 204 and the stacked device 1104. The first encapsulation layer 207 may have a uniform thickness over a top surface and the side surface of the stacked device 1104, and/or a uniform thickness over a top surface and the side surface of the integrated device 1114. The encapsulation layer 207 may have thickness of approximately 80 micrometers (μm)±8 micrometers (μm). The undercut of the encapsulation layer 207 for the stacked device 1104 may be defined relative to the side surface or side wall of the first integrated device 1114. Similar to the other packages in the disclosure, the encapsulation layer 207 may have an undercut value in a range of −20-50 micrometers (μm) for various devices located over a void. The undercut value(s) of the encapsulation layer 207 for an integrated device and/or stacked device may be variable. At least a portion of the encapsulation layer 207 may have a uniform thickness, as described in FIG. 2.

Figure 12:
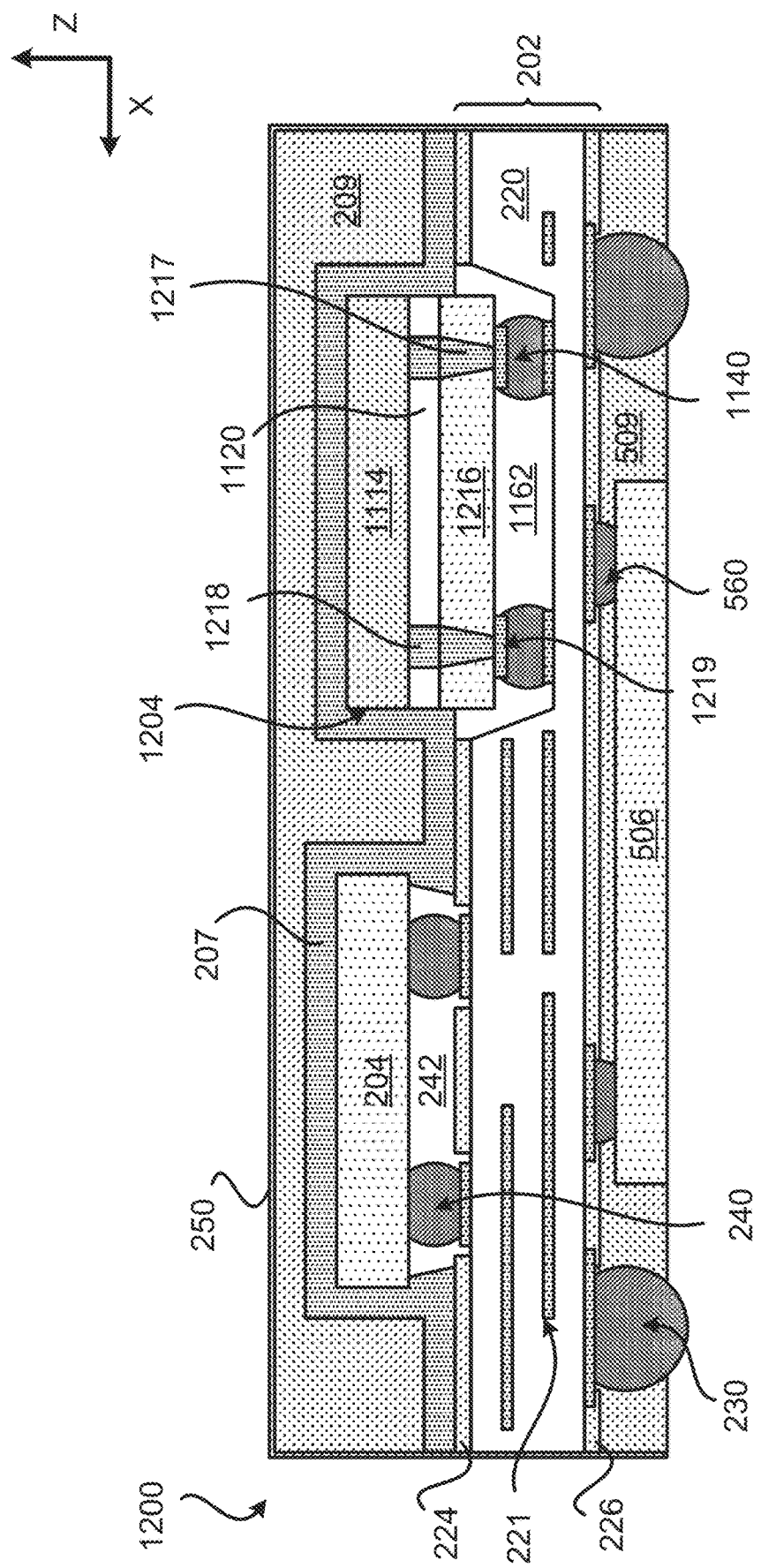
FIG. 12 illustrates a profile view of another package that includes a substrate, a stacked device, and an encapsulation layer with controlled undercut.

FIG. 12 illustrates a package 1200 that includes an encapsulation layer that includes various undercuts. The package 1200 is similar to the package 1100 of FIG. 11, and includes similar or the same components as the package 1100. The package 1200 includes a stacked device 1204, the void 1162 and a substrate 202 that includes a cavity. The stacked device 1204 may include stacked filters. The stacked device 1204 includes a first integrated device 1114 configured as a first filter (e.g., means for first signal filtering), a second integrated device 1116 configured as a second filter (e.g., means for second signal filtering), an interconnect frame 1218 and a plurality of interconnects 1219. The first integrated device 1114 may be a top filter and the second integrated device 1116 may be a bottom filter. The first integrated device 1114 is coupled to the interconnect frame 1218. The second integrated device 1116 is coupled to the interconnect frame 1218. A void 1120 may be located between the first integrated device 1114, the second integrated device 1116 and the interconnect frame 1218. The plurality of interconnects 1219 may be located in and over the second integrated device 1116. The plurality of interconnects 1219 may include vias, traces and/or pads. The stacked device 1204 is coupled to the substrate 202 through the plurality of solder interconnects 1140. At least part of the stacked device 1124 is located in the cavity of the substrate 202. The void 1162 includes the cavity of the substrate 202.

The encapsulation layer 207 is formed over the substrate 202, the integrated device 204 and the stacked device 1204 such that the encapsulation layer 207 has an approximately uniform thickness, as the encapsulation layer 207 approximately follows the contour of the substrate 202, the integrated device 204 and the stacked device 1204. The first encapsulation layer 207 may have a uniform thickness over a top surface and the side surface of the stacked device 1204, and/or a uniform thickness over a top surface and the side surface of the integrated device 1114. The encapsulation layer 207 may have thickness of approximately 80 micrometers (μm)±8 micrometers (μm). The undercut of the encapsulation layer 207 for the stacked device 1204 may be defined relative to the side surface or side wall of the first integrated device 1114. Similar to the other packages in the disclosure, the encapsulation layer 207 may have an undercut value in a range of −20-50 micrometers (μm) for various devices located over a void. The undercut value(s) of the encapsulation layer 207 for an integrated device and/or stacked device may be variable. At least a portion of the encapsulation layer 207 may have a uniform thickness, as described in FIG. 2.

It is noted that various features in one package may be implemented in any of the packages described in the disclosure. The undercut shown for an encapsulation layer is exemplary. Different implementations of the package may include an encapsulation layer with different and/or varying undercuts, including positive undercuts, negative undercuts, neutral undercuts, or combinations thereof. The range of the undercut values is exemplary. Different implementations may have undercuts with different values. An encapsulation layer surrounding an integrated device may have the same or different undercut values for different sides of the integrated devices. Any of the integrated devices and/or devices illustrated and described in the disclosure may be surrounded by at least one encapsulation layer such that all sides of the integrated devices and/or devices may be surrounded by the a least one encapsulation layer. All sides of the integrated devices and/or devices may be surrounded by an encapsulation layer such that the encapsulation layer may have a particular undercut value in a range of −20-50 micrometers (μm), for each particular side of the integrated devices and/or devices.

The various configurations of a package shown in the disclosure may provide different technical advantages, including lower fabrication costs, improved reliability (e.g., through better CTE mismatch), and improved performance (e.g., by reducing the routing paths between components, better defined voids).

Having described various packages, a sequence for fabricating a package will now be described below.

Exemplary Sequence for Fabricating a Package that Includes an Encapsulation Layer with Controlled Undercut FIGS. 13A-13D illustrate an exemplary sequence for providing or fabricating a package that includes an encapsulation layer with controlled undercut. In some implementations, the sequence of FIGS. 13A-13D may be used to provide or fabricate the package 600 of FIG. 6, or any of the devices (e.g., 200, 300, 500, 700, 800, 900, 1000, 1100, 1200) described in the disclosure.

It should be noted that the sequence of FIGS. 13A-13D may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure.

Figure 13A:
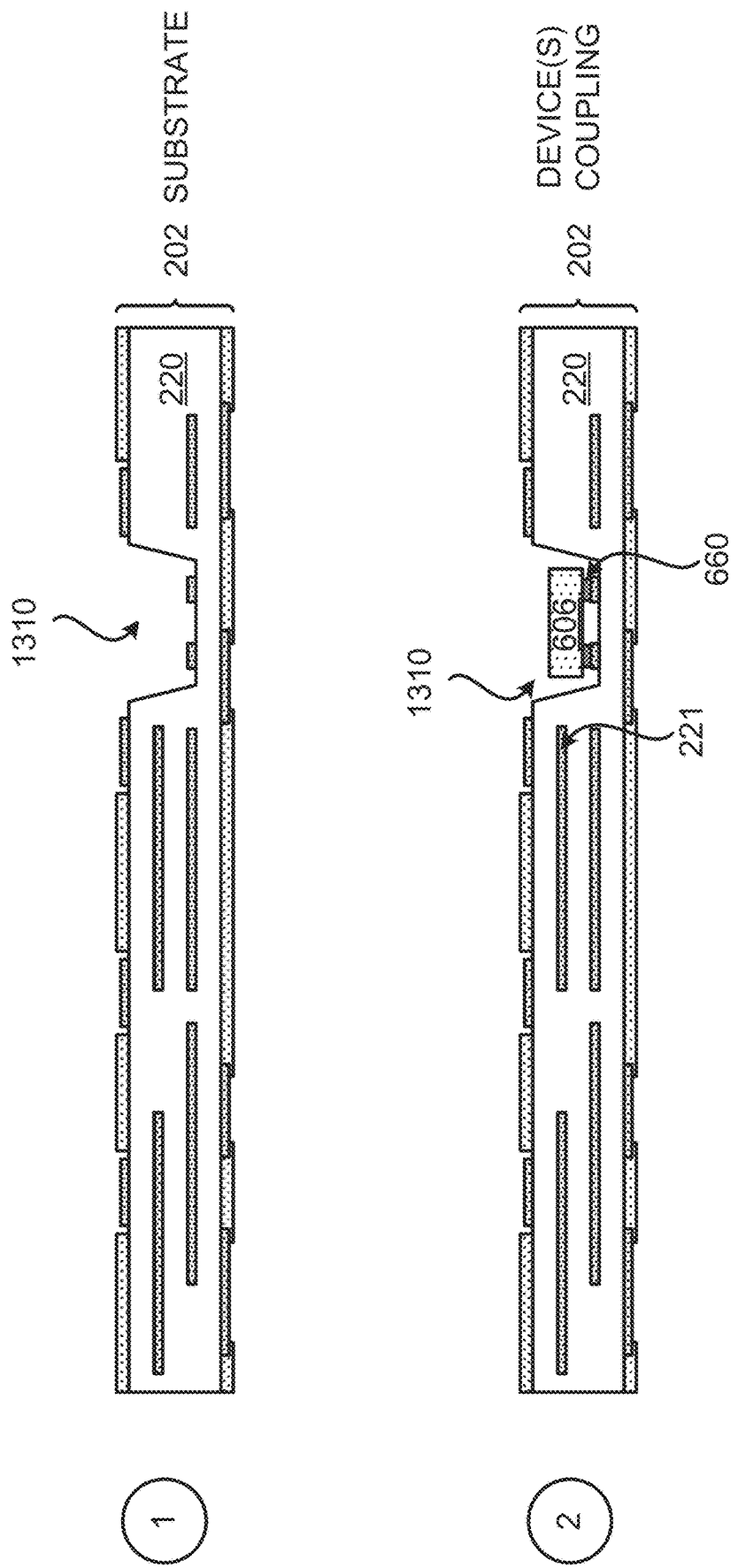
FIGS. 13A-13D illustrate an exemplary sequence for fabricating a die that includes a frame.

Stage 1, as shown in FIG. 13A, illustrates a state after a substrate 202 is provided or fabricated. The substrate 202 includes at least one dielectric layer 220, a plurality of interconnects 222 (e.g., traces, pads, vias), a cavity 1310, a solder resist layer 224 and a solder resist layer 226. An example of fabricating a substrate is shown and described in FIGS. 15A-15B. The fabrication of the substrate may include a lamination process and plating process. Examples of processes for fabricating a substrate includes a semi additive process (SAP) and a modified semi additive process (mSAP). However, different implementations may fabricate a substrate differently. Different implementations may provide different types of substrates (e.g., coreless substrate, laminate substrate).

Stage 2 illustrates a state after the integrated device 606 is coupled to the substrate 202 through the plurality of solder interconnects 660. The integrated device 606 may be placed in the cavity 1310 of the substrate 202 through a pick and place process. A reflow solder process may be used to couple the integrated device 606 to the plurality of interconnects 221, through the plurality of solder interconnects 660.

Figure 13B:
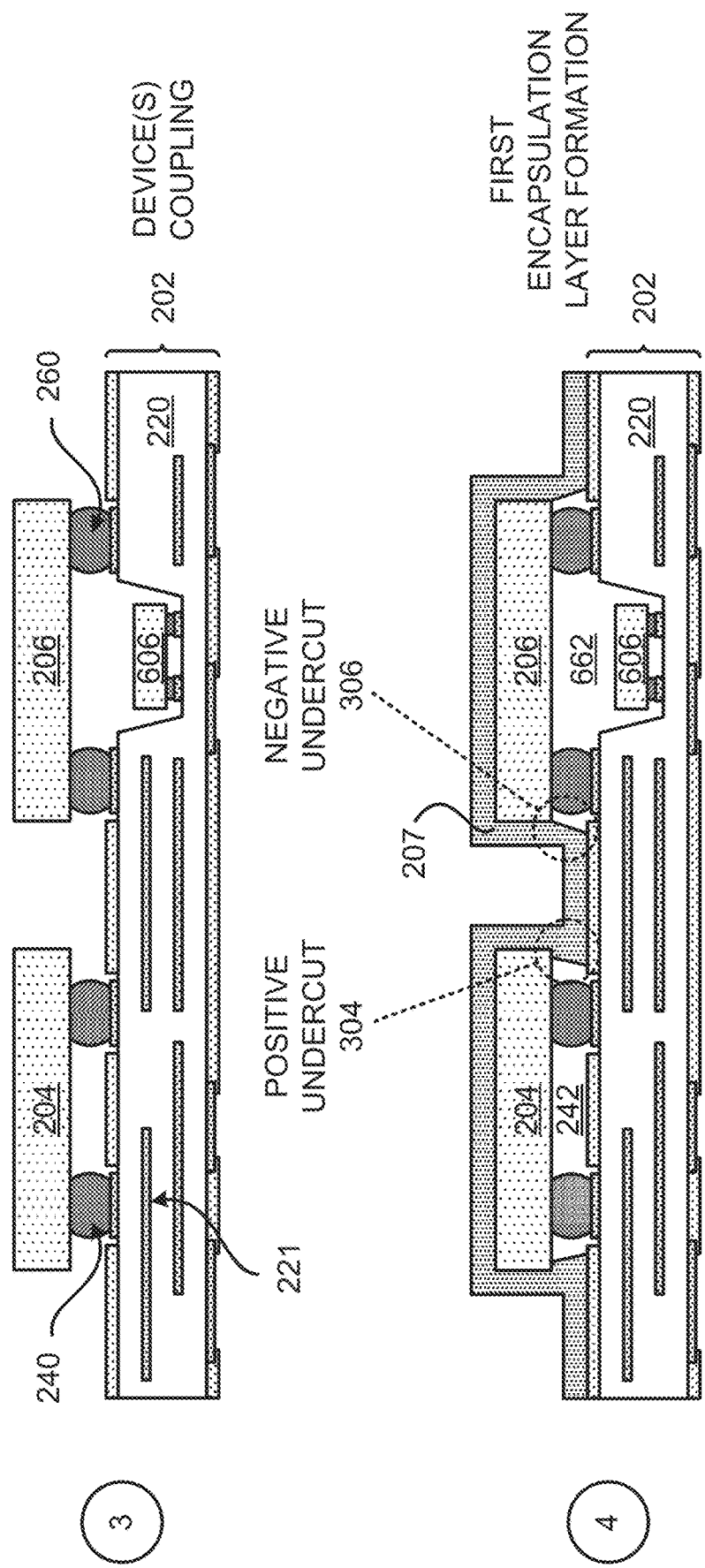

Stage 3, as shown in FIG. 13B, illustrates a state after the integrated device 204 is coupled to the first surface of the substrate 202 through the plurality of solder interconnects 240, and the integrated device 206 is coupled to the first surface of the substrate 202 through the plurality of solder interconnects 260. The integrated devices 204 and 206 may be placed over the first surface of the substrate 202 through a pick and place process. A reflow solder process may be used to couple (i) the integrated device 204 to the plurality of interconnects 221, through the plurality of solder interconnects 240, and (ii) the integrated device 206 to the plurality of interconnects 221, through the plurality of solder interconnects 260.

Stage 4 illustrates a state after the encapsulation layer 207 is formed over the substrate 202, the integrated device 204 and the integrated device 206. The encapsulation layer 207 may be a first encapsulation layer (e.g., means for first encapsulation). The encapsulation layer 207 may include a mold, a resin and/or an epoxy. The encapsulation layer 207 may include an isotropic material and/or an anisotropic material. A sheet molding process (e.g., vacuum lamination, compression molding) may be used to form the encapsulation layer 207. For each of the integrated device, the encapsulation layer 207 may have an undercut value in a range of −20-50 micrometers (μm). The undercut value of the encapsulation layer 207 for an integrated device and/or stacked device may be variable.

The encapsulation layer 207 is formed over the substrate 202, the integrated device 204 and the integrated device 206 such that the encapsulation layer 207 has an approximately uniform thickness, as the encapsulation layer 207 approximately follows the contour of the substrate 202, the integrated device 204 and the integrated device 206. For example, the encapsulation layer 207 may have thickness of approximately 80 micrometers (μm)±8 micrometers (μm). The sheet molding process may allow for accurate and precise control of the undercut for the encapsulation layer 207, which in turns allows for accurate and precise control of the voids (e.g., 242, 262, 662) between an integrated device and a substrate. The encapsulation layer 207 may be formed without the need of a foil and/or a sealing film that follows the contours of the substrate 202, the integrated device 204 and the integrated device 206. This may be done by using a sheet mold of the encapsulation layer 207 that has a low viscosity value, so that the encapsulation layer 207 does not flow substantially underneath the integrated device(s). Thus, a package may be fabricated that is free of a foil and/or a sealing film between the encapsulation layer 207 and the substrate 202, the integrated device 204 and the integrated device 206. One advantage of the foil free package or a sealing film free package, is a package that is cheaper to fabricate due to fact that this requires at least one less step and at least one less material.

Figure 13C:
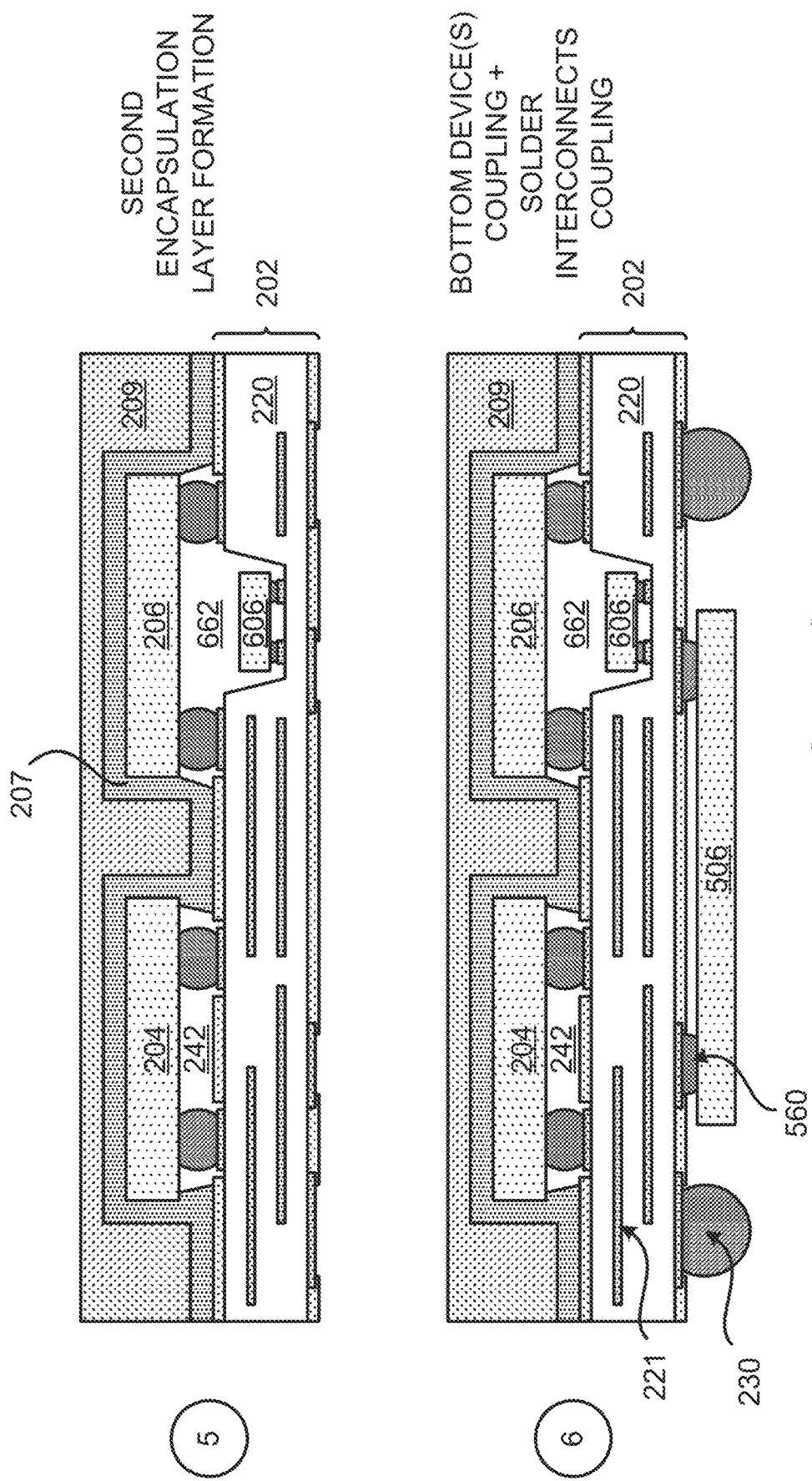

Stage 5, as shown in FIG. 13C, illustrates a state after the encapsulation layer 209 is formed over the encapsulation layer 207. A compression molding process, a transfer molding process, or a liquid molding process may be used to form the encapsulation layer 209. The encapsulation layer 209 may be photo etchable. There may be a boundary interface between the encapsulation layer 209 and the encapsulation layer 207. The encapsulation layer 209 may include a mold, a resin and/or an epoxy. Moreover, in addition to molding processes, the encapsulation layer 209 may be laminated together with the encapsulation layer 207 to create a single sheet. This single sheet comprising the encapsulation layer 207 and the encapsulation layer 209 may be applied to the substrate 202, the integrated device 204 and the integrated device 206 via vacuum lamination or compression molding.

Stage 6 illustrates a state after the integrated device 506 is coupled to the second surface of the substrate 202 through the plurality of solder interconnects 560. The integrated device 506 may be placed over the second surface of the substrate 202 through a pick and place process. A reflow solder process may be used to couple the integrated device 506 to the plurality of interconnects 221, through the plurality of solder interconnects 560. Stage 6 also illustrates the plurality of solder interconnects 230 coupled to the substrate 202. A reflow solder process may be used to couple the plurality of solder interconnects 230 to the substrate 202.

Figure 13D:
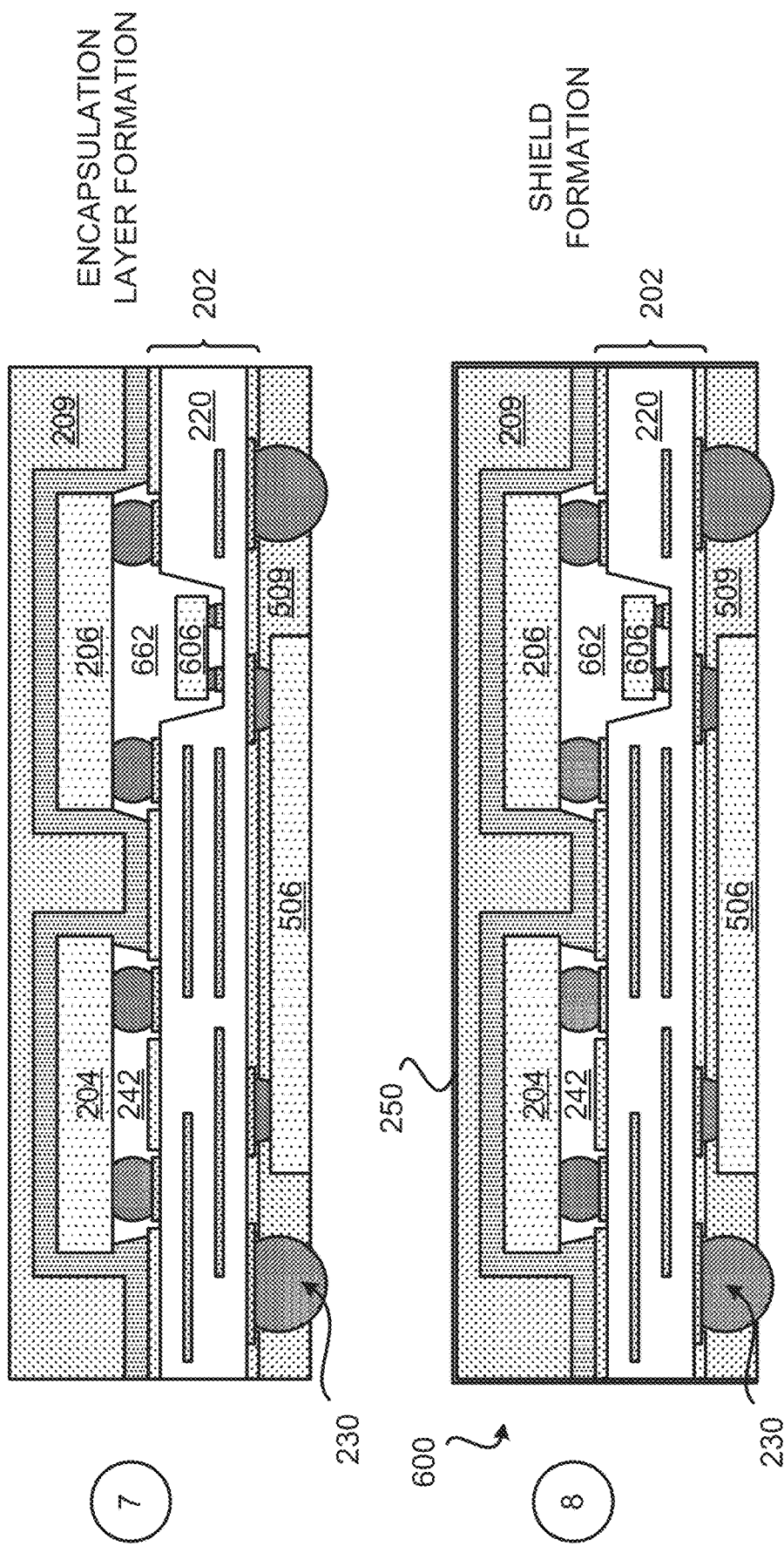

Stage 7, as shown in FIG. 13D, illustrates a state after the encapsulation layer 509 is formed over the second surface of the substrate 202. A compression molding process, a transfer molding process, or a liquid molding process may be used to form the encapsulation layer 509. The encapsulation layer 509 may be photo etchable. The encapsulation layer 509 may include a mold, a resin and/or an epoxy. The encapsulation layer 509 may encapsulate the integrated device 506 and portions of the plurality of solder interconnects 230. In some implementations, the encapsulation layer 509 may be located over a back side of the integrated device 506.

Stage 8 illustrates a state after the EMI shield 250 is formed and located over a surface of the encapsulation layer 209 and a side surface of the substrate 202. A sputtering process, a spray coating, and/or a plating process may be used to form the EMI shield 250. The EMI shield 250 may include an electrically conductive layer. The EMI shield 250 may be configured to be coupled to ground. Stage 8 may illustrate the package 600 of FIG. 6.

Figure 14:
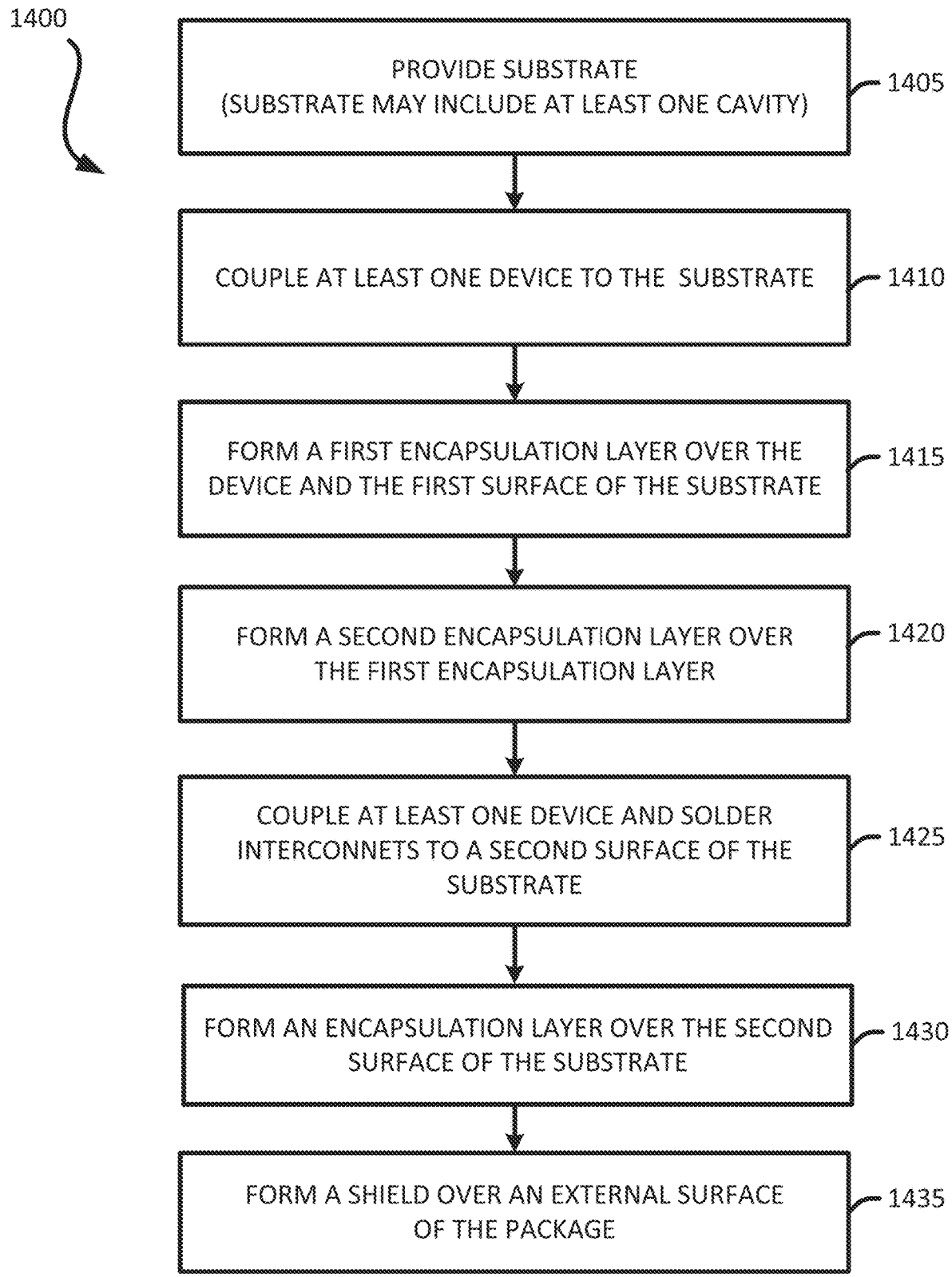
FIG. 14 illustrates an exemplary flow diagram of a method for fabricating package that includes a substrate, an integrated device, and an encapsulation layer with controlled undercut.

Exemplary Flow Diagram of a Method for Fabricating a Package that Includes an Encapsulation Layer with Controlled Undercut In some implementations, fabricating a package with an encapsulation layer with controlled undercut includes several processes. FIG. 14 illustrates an exemplary flow diagram of a method 1400 for providing or fabricating a package with an encapsulation layer with controlled undercut. In some implementations, the method 1400 of FIG. 14 may be used to provide or fabricate the package 600 of FIG. 6 described in the disclosure. However, the method 1400 may be used to provide or fabricate any of the devices (e.g., 200, 300, 500, 700, 800, 900, 1000, 1100, 1200) described in the disclosure.

It should be noted that the sequence of FIG. 14 may combine one or more processes in order to simplify and/or clarify the method for providing or fabricating a package. In some implementations, the order of the processes may be changed or modified.

The method provides (at 1405) a substrate (e.g., 202). The substrate may be provided or fabricated. The substrate may include at least one dielectric layer 220, a plurality of interconnects 222 (e.g., traces, pads, vias), a cavity 1310, a solder resist layer 224 and a solder resist layer 226. An example of fabricating a substrate is shown and described in FIGS. 15A-15B. The fabrication of the substrate may include a lamination process and plating process. Examples of processes for fabricating a substrate includes a semi additive process (SAP) and a modified semi additive process (mSAP). However, different implementations may fabricate a substrate differently. Different implementations may provide different types of substrates (e.g., coreless substrate, laminate substrate). Stage 1 of FIG. 13A illustrates and describes an example of a substrate.

The method couples (at 1410) at least one device (e.g., 204, 206, 606) to the substrate (e.g., 202). The device may be placed in a cavity of the substrate. The device may be coupled to a first surface of the substrate. A pick and place process may be used to place and couple the device(s) to a substrate. Stages 2 and 3 of FIGS. 13A-13B illustrate and describe examples of devices coupled to a substrate.

The method forms (at 1415) an encapsulation layer (e.g., 207) over the first surface of the substrate 202 and the devices (e.g., 204, 206). The encapsulation layer 207 may be a first encapsulation layer (e.g., means for first encapsulation). The encapsulation layer 207 may include a mold, a resin and/or an epoxy. The encapsulation layer 207 may include an isotropic material and/or an anisotropic material. A sheet molding process (e.g., vacuum lamination, compression molding) may be used to form the encapsulation layer 207. For each of the integrated device, the encapsulation layer 207 may have an undercut value in a range of −20-50 micrometers (μm). The undercut value(s) of the encapsulation layer 207 for an integrated device and/or stacked device may be variable.

The encapsulation layer 207 is formed (e.g., disposed) over the substrate 202, the integrated device 204 and the integrated device 206 such that the encapsulation layer 207 has an approximately uniform thickness, as the encapsulation layer 207 approximately follows the contour of the substrate (e.g., 202) and the devices (e.g., 204, 206). For example, the encapsulation layer 207 may have thickness of approximately 80 micrometers (μm)±8 micrometers (μm). The sheet molding process may allow for accurate and precise control of the undercut for the encapsulation layer 207, which in turns allows for accurate and precise control of the voids (e.g., 242, 262, 662) between a device and a substrate. The encapsulation layer 207 may be formed without the need of a foil and/or a sealing film that follows the contours of the substrate 202, the integrated device 204 and the integrated device 206. This may be done by using a sheet mold of the encapsulation layer 207 that has a low viscosity value, so that the encapsulation layer 207 does not flow substantially underneath the integrated device(s). Stage 4 of FIG. 13C illustrates and describes an example of an encapsulation layer that is formed over a substrate and at least one device.

The method forms (at 1420) a second encapsulation layer (e.g., 209) over the first encapsulation layer (e.g., 207). A compression molding process, a transfer molding process, or a liquid molding process may be used to form the encapsulation layer 209. The encapsulation layer 209 may be photo etchable. There may be a boundary interface between the encapsulation layer 209 and the encapsulation layer 207. The encapsulation layer 209 may include a mold, a resin and/or an epoxy. Stage 5 of FIG. 13C illustrates and describes an example of a second encapsulation layer formed over a first encapsulation layer.

The method couples (at 1425) at least one device (e.g., 506) and a plurality of solder interconnects (e.g., 560) to a second surface (e.g., bottom surface) of the substrate (e.g., 202). A pick and place process and a reflow solder process may be used to couple the integrated device 506 to the substrate 202. A reflow solder process may be used to couple the plurality of solder interconnects 230 to the substrate 202. Stage 6 of FIG. 13C illustrates and describes an example of a device and solder interconnects coupled to a substrate.

The method forms (at 1430) an encapsulation layer (e.g., 509) over the second surface of the substrate 202. A compression molding process, a transfer molding process, or a liquid molding process may be used to form the encapsulation layer 509. The encapsulation layer 509 may be photo etchable. The encapsulation layer 509 may include a mold, a resin and/or an epoxy. The encapsulation layer 509 may encapsulate the integrated device 506 and portions of the plurality of solder interconnects 230. Stage 7 of FIG. 13D illustrates and describes an example of an encapsulation layer formed over a second surface of a substrate.

The method forms (at 1435) an EMI shield (e.g., 250) over a surface of the encapsulation layer 209 and a side surface of the substrate 202. A sputtering process, a spray coating, and/or a plating process may be used to form the EMI shield 250. The EMI shield 250 may include an electrically conductive layer. The EMI shield 250 may be configured to be coupled to ground. Stage 8 of FIG. 13D illustrates and describes an example of forming an EMI shield.

Exemplary Sequence for Fabricating a Substrate

Figure 15A:
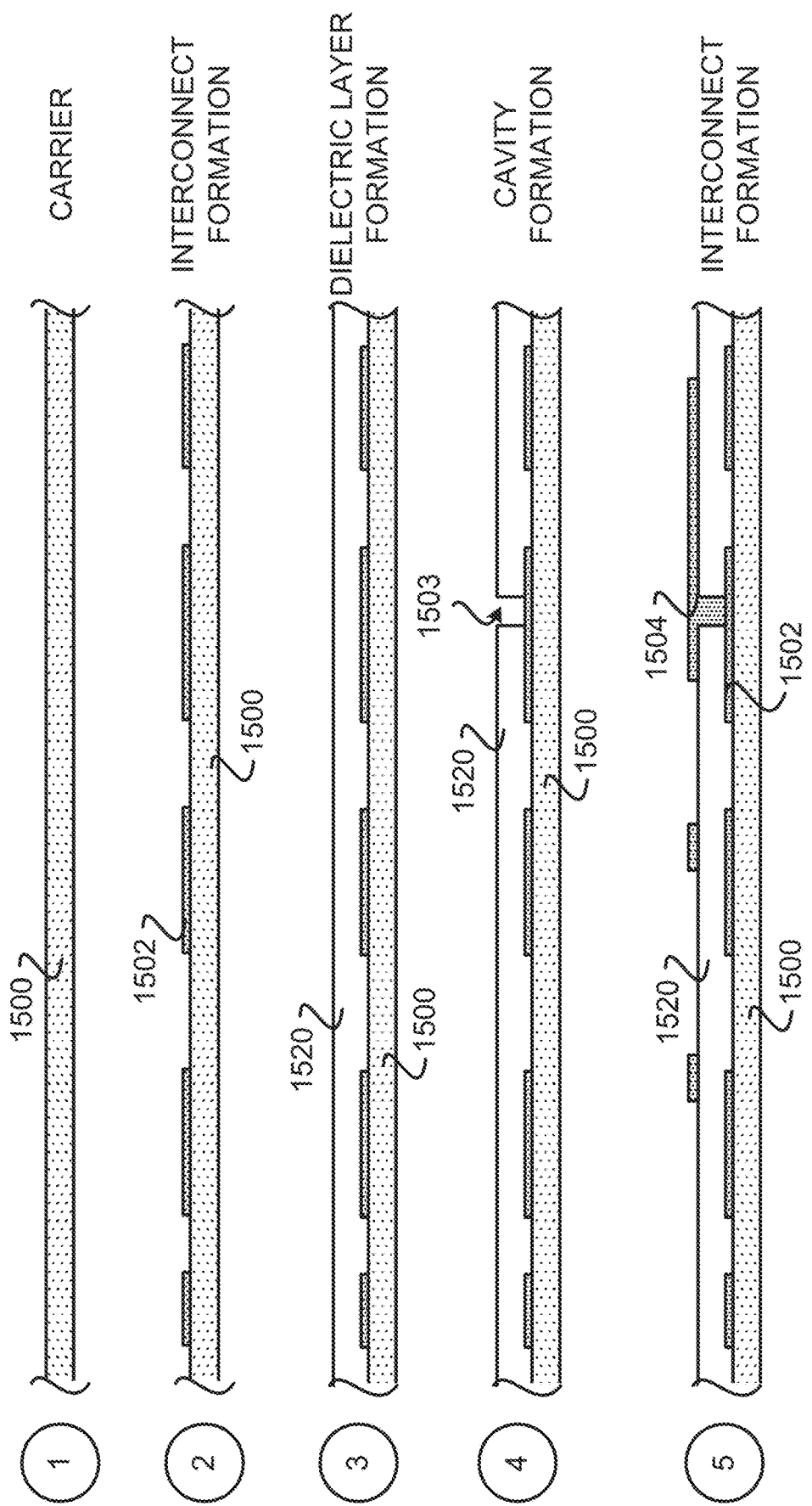
FIGS. 15A-15C illustrate an exemplary sequence for fabricating a substrate.
Figure 15B:
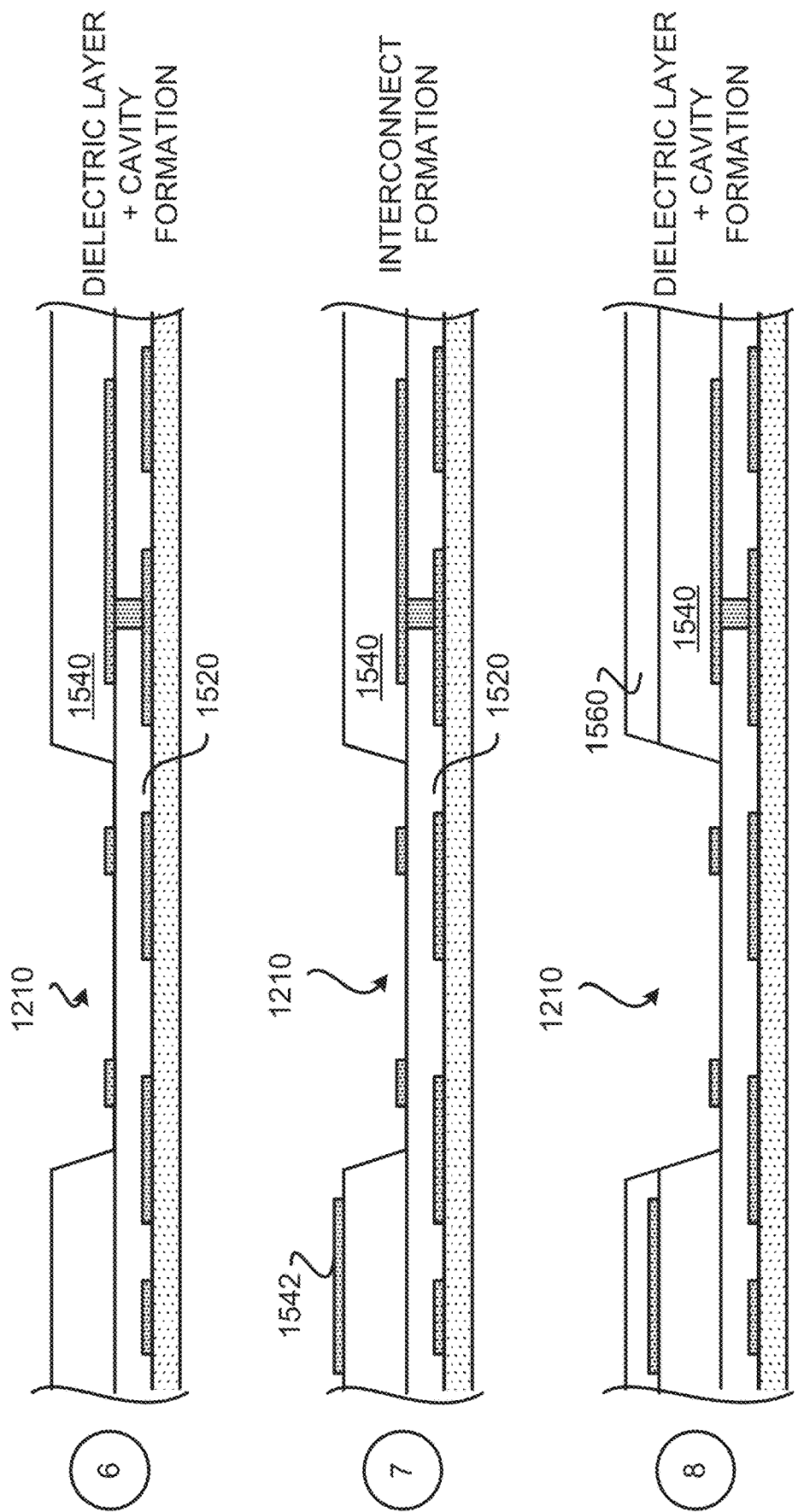
Figure 15C:
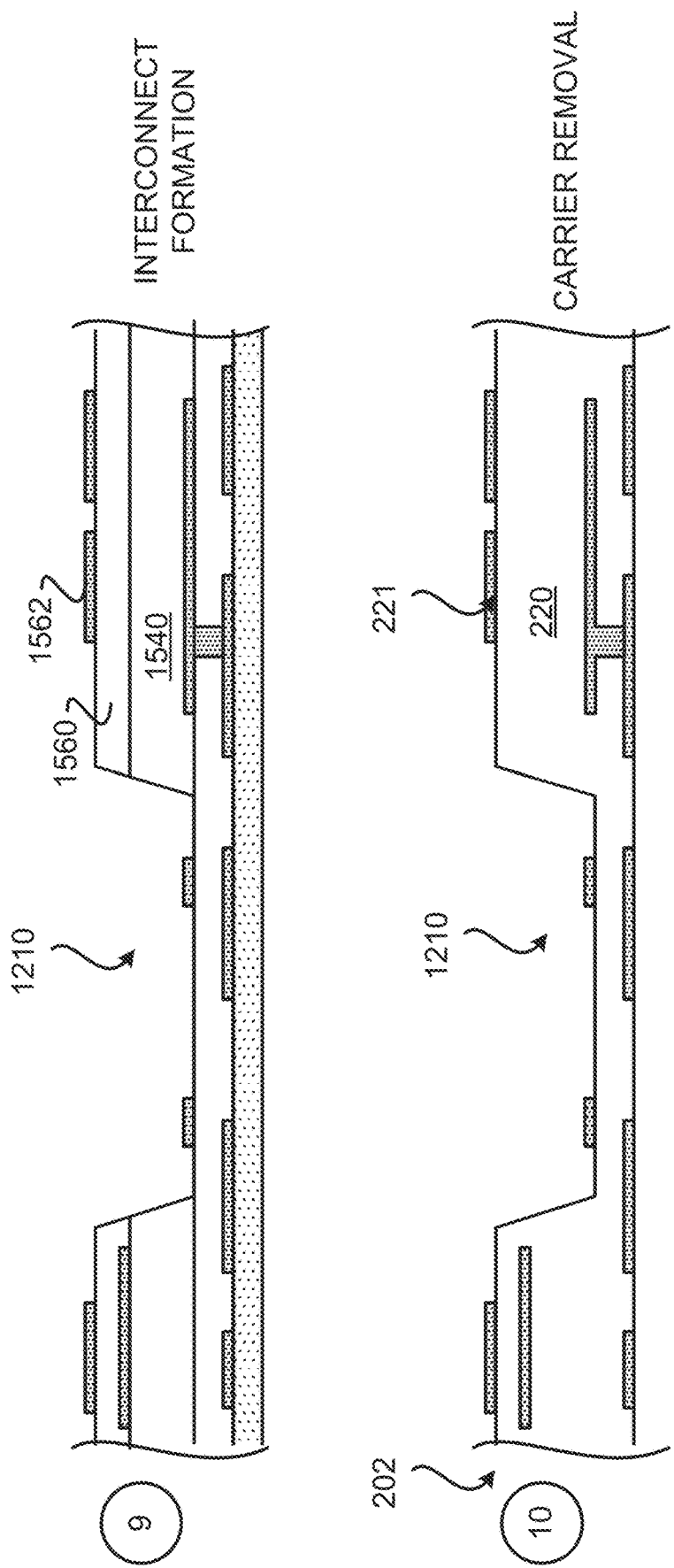

FIGS. 15A-15C illustrate an exemplary sequence for providing or fabricating a substrate. In some implementations, the sequence of FIGS. 15A-15C may be used to provide or fabricate the substrate 202 of FIG. 6, or any of the substrates described in the disclosure. As mentioned above, different implementations may use different substrate, including a laminate substrate and a coreless substrate (e.g., embedded trace substrate). The substrate shown in FIG. 15A-15C is an example of a possible substrate that may be used.

It should be noted that the sequence of FIGS. 15A-15C may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Stage 1, as shown in FIG. 15A, illustrates a state after a carrier 1500 is provided. The carrier 1500 may be a substrate.

Stage 2 illustrates a state after interconnects 1502 are formed over the carrier 1500. The interconnects 1502 may be interconnects from the plurality of interconnects 221. A plating process may be used to form the interconnects 1502.

Stage 3 illustrates a state after a dielectric layer 1520 is formed over the interconnects 1502 and the carrier 1500. A deposition and/or lamination process may be used to form the dielectric layer 1520.

Stage 4 illustrates a state after one or more cavities 1503 are formed in the dielectric layer 1520. A laser process (e.g., laser ablation) or a photo etching process (e.g., photolithography process) may be used to form the one or more cavities 1503.

Stage 5 illustrates a state after interconnects 1504 are formed over the dielectric layer 1520. The interconnects 1504 may be interconnects from the plurality of interconnects 221. A plating process may be used to form the interconnects 1504.

Stage 6, as shown in FIG. 15B, illustrates a state after a dielectric layer 1540 is formed over the dielectric layer 1520. The dielectric layer 1540 may be made of the same material as the dielectric layer 1520. A deposition and/or lamination process may be used to form the dielectric layer 1540. The dielectric layer 1540 may be formed such that a cavity 1310 is formed.

Stage 7 illustrates a state after interconnects 1542 are formed over the dielectric layer 1540. The interconnects 1542 may be interconnects from the plurality of interconnects 221. A plating process may be used to form the interconnects 1542. In some implementations, one or more cavities may have been formed in the dielectric layer 1540 and interconnects 1542 may be formed over the cavities of the dielectric layer 1540.

Stage 8 illustrates a state after a dielectric layer 1560 is formed over the dielectric layer 1540. The dielectric layer 1560 may be the same material as the dielectric layer 1520 and/or 1540. A deposition and/or lamination process may be used to form the dielectric layer 1560. The dielectric layer 1560 may be formed such that a cavity 1310 is formed.

Stage 9, as shown in FIG. 15C, illustrates a state the interconnects 1562 and 1564 are formed over the dielectric layer 1560. The interconnects 1562 may be interconnects from the plurality of interconnects 221. A plating process may be used to form the interconnects 1562. In some implementations, one or more cavities may have been formed in the dielectric layer 1560 and interconnects 1562 may be formed over the cavities of the dielectric layer 1560.

Stage 10 illustrates a state after the carrier 1500 is removed. Stage 10 may illustrate a portion of the substrate 202. The dielectric layers 220 may represent the dielectric layers 1520, 1540 and 1560. The interconnects 221 may represent the interconnects 1502, 1504, 1542 and 1562 and 1564.

Exemplary Sequence for Fabricating a Stacked Device

Figure 16A:
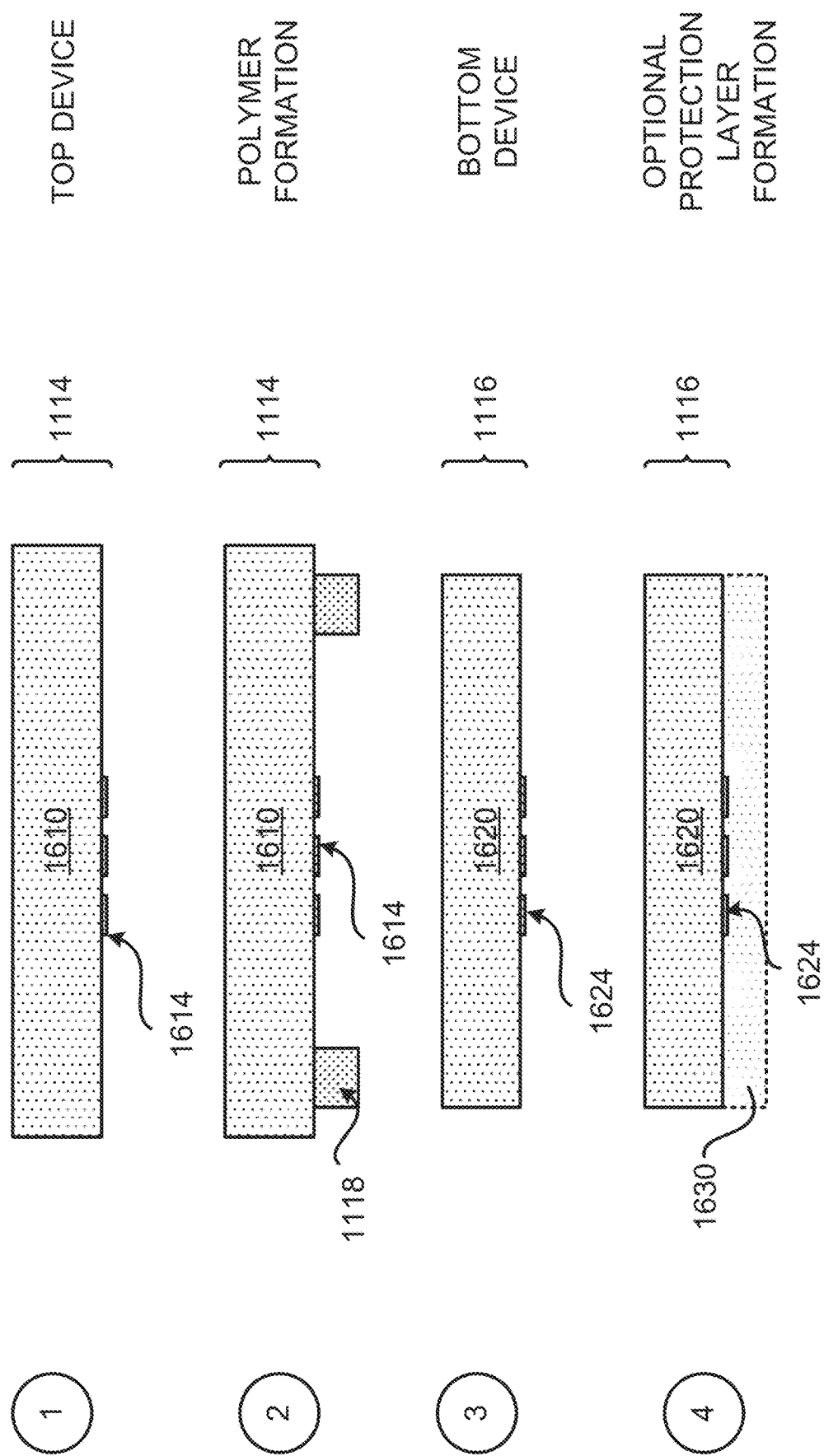
FIGS. 16A-16B illustrate an exemplary sequence for fabricating a device comprising stacked integrated devices.
Figure 16B:
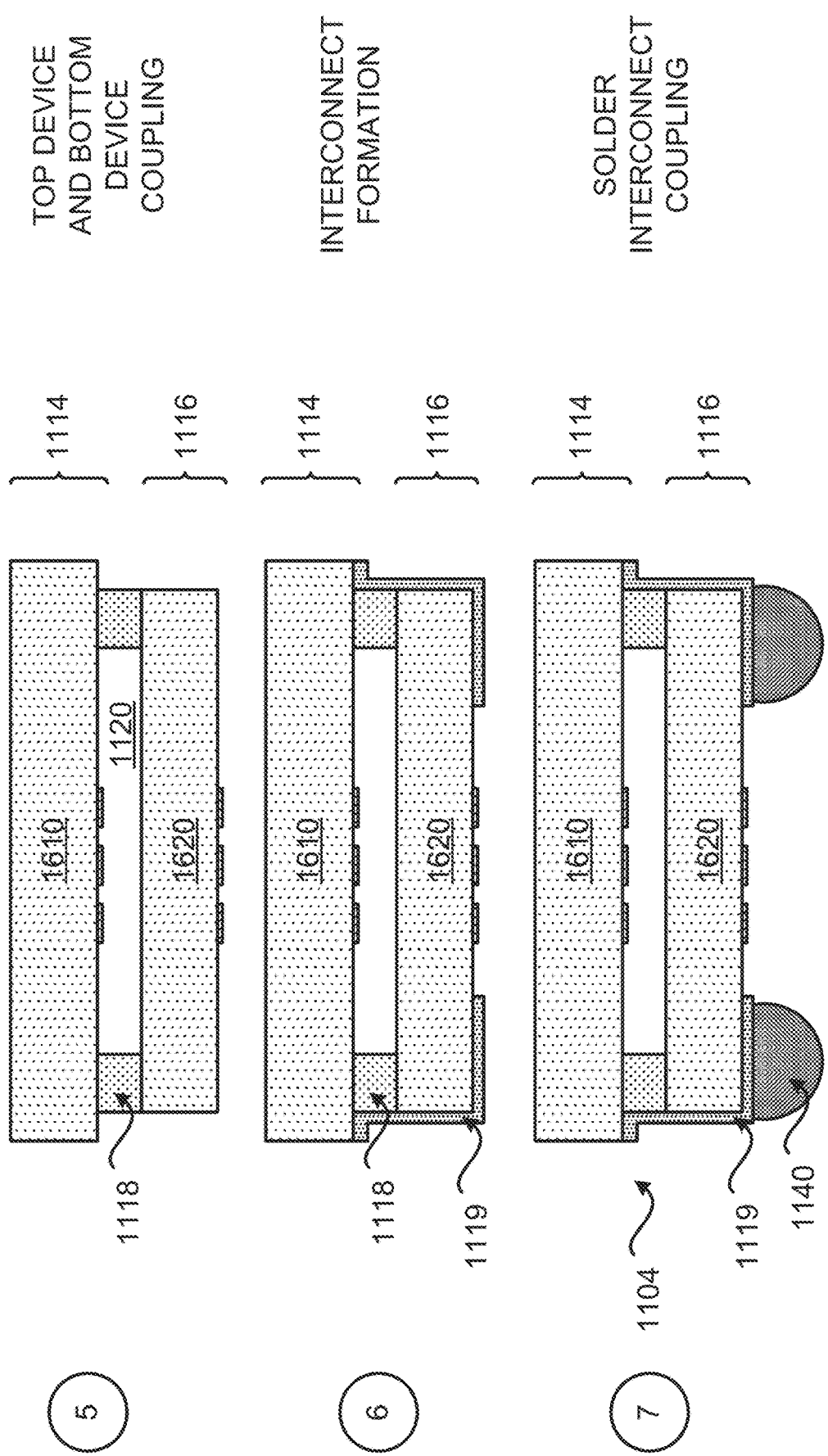

FIGS. 16A-16B illustrate an exemplary sequence for providing or fabricating a device that includes stacked integrated devices (e.g., stacked filters). In some implementations, the sequence of FIGS. 16A-16B may be used to provide or fabricate the stacked device 1104 of FIG. 11, or any of the stacked devices described in the disclosure.

It should be noted that the sequence of FIGS. 16A-16B may combine one or more stages in order to simplify and/or clarify the sequence for providing or fabricating a device that includes stacked integrated devices. In some implementations, the order of the processes may be changed or modified. In some implementations, one or more of processes may be replaced or substituted without departing from the spirit of the disclosure.

Stage 1, as shown in FIG. 16A, illustrates a state after an integrated device 1114 is provided. The integrated device 1114 may be configured as a filter. The integrated device 1114 may be a bare die filter (e.g., SAW filter, BAW filter). The integrated device 1114 includes a substrate 1610 and at least one metal layer 1614. The substrate 1610 may be a piezoelectric substrate. For example, the substrate 1610 may include a piezoelectric material (e.g., Aluminum Nitride (AlN), quartz, Lithium Niobate, Lithium Tantalate). In another example, the substrate 1610 may include a piezoelectric layer that is formed and located over a surface of the substrate 1610. For example, the substrate 1610 may include glass with a piezoelectric layer formed and located over a surface of the glass. Other materials may be used instead of glass. A piezoelectric substrate as used in the disclosure may mean a substrate that includes a piezoelectric material and/or a substrate that includes a piezoelectric layer coupled to and located over a surface of the substrate. Different implementations may use different materials for the piezoelectric material and/or the piezoelectric layer.

The at least one metal layer 1614 is formed over the substrate 1610. In instances when the substrate 1610 includes a piezoelectric layer formed and located over a surface of the substrate 1610, the at least one metal layer 1614 may be formed and located over the piezoelectric layer. The at least one metal layer 1614 may include an electrically conductive material, such as copper (Cu). The at least one metal layer 1614 may be patterned and/or configured as interconnects, electrodes and/or transducers for the integrated device 1114. In some implementations, the metal layer 1614 may include a first metal layer and a second metal layer. The first metal layer may be configured to operate as at least one transducer, and the second metal layer may be configured as at least one interconnect coupled to the transducer. In some implementations, the first metal layer of the metal layer 1614 may be formed and then the second metal layer of the metal layer 1614 may be formed.

Stage 2 illustrates a state after a polymer frame 1118 is coupled to the integrated device 1114. A deposition process may be used to form and couple the polymer frame 1118 to the integrated device 1114.

Stage 3 illustrates a state after an integrated device 1116 is provided. The integrated device 1116 may be configured as a filter. The integrated device 1116 may be a bare die filter (e.g., SAW filter, BAW filter). The integrated device 1116 includes a substrate 1620 and at least one metal layer 1624. The substrate 1620 may be a piezoelectric substrate. For example, the substrate 1610 may include a piezoelectric material (e.g., Aluminum Nitride (AlN), quartz, Lithium Niobate, Lithium Tantalate). In another example, the substrate 1620 may include a piezoelectric layer that is formed and located over a surface of the substrate 1620. For example, the substrate 1620 may include glass with a piezoelectric layer formed and located over a surface of the glass. Other materials may be used instead of glass. A piezoelectric substrate as used in the disclosure may mean a substrate that includes a piezoelectric material and/or a substrate that includes a piezoelectric layer coupled to and located over a surface of the substrate. Different implementations may use different materials for the piezoelectric material and/or the piezoelectric layer.

The at least one metal layer 1624 is formed over the substrate 1620. In instances when the substrate 1620 includes a piezoelectric layer formed and located over a surface of the substrate 1620, the at least one metal layer 1624 may be formed and located over the piezoelectric layer. The at least one metal layer 1624 may include an electrically conductive material, such as copper (Cu). The at least one metal layer 1624 may be patterned and/or configured as interconnects, electrodes and/or transducers for the integrated device 1116. In some implementations, the metal layer 1624 may include a first metal layer and a second metal layer. The first metal layer may be configured to operate as at least one transducer, and the second metal layer may be configured as at least one interconnect coupled to the transducer. In some implementations, the first metal layer of the metal layer 1624 may be formed and then the second metal layer of the metal layer 1624 may be formed.

Stage 4 illustrates a state after an optional protection layer 1630 is formed over the substrate 1620 and the at least one metal layer 1624. The protection layer 1630 may be deposited over the substrate 1620 and the at least one metal layer 1624.

Stage 5, as shown in FIG. 16B illustrates a state after the integrated device 1114 is coupled to the integrated device 1116 such that a void 1120 is formed between the integrated device 1114, the integrated device 1116 and the polymer frame 1118. A thermal compression process may be used to couple the integrated device 1114 to the integrated device 1116. If a protection layer 1630 is formed, the protection layer 1630 may be removed after coupling the integrated device 1114 to the integrated device 1116.

Stage 6 illustrates a state after a plurality of interconnects 1119 is formed over the surface of the integrated device 1114, the integrated device 1116 and the polymer frame 1118. The plurality of interconnects 1119 may be coupled to the at least one metal layer 1614 and the at least one metal layer 1624. A platting process, a sputtering process and/or a spray process may be used to form the plurality of interconnects 1119.

Stage 7 illustrates a state after the plurality of solder interconnects 1140 is coupled to the plurality of interconnects 1119. A reflow solder process may be used to couple the plurality of solder interconnects 1140 to the plurality of interconnects 1119. Stage 7 may illustrate the stacked device 1104 as shown in FIG. 11.

Exemplary Sequence for Fabricating a Stacked Device

Figure 17A:
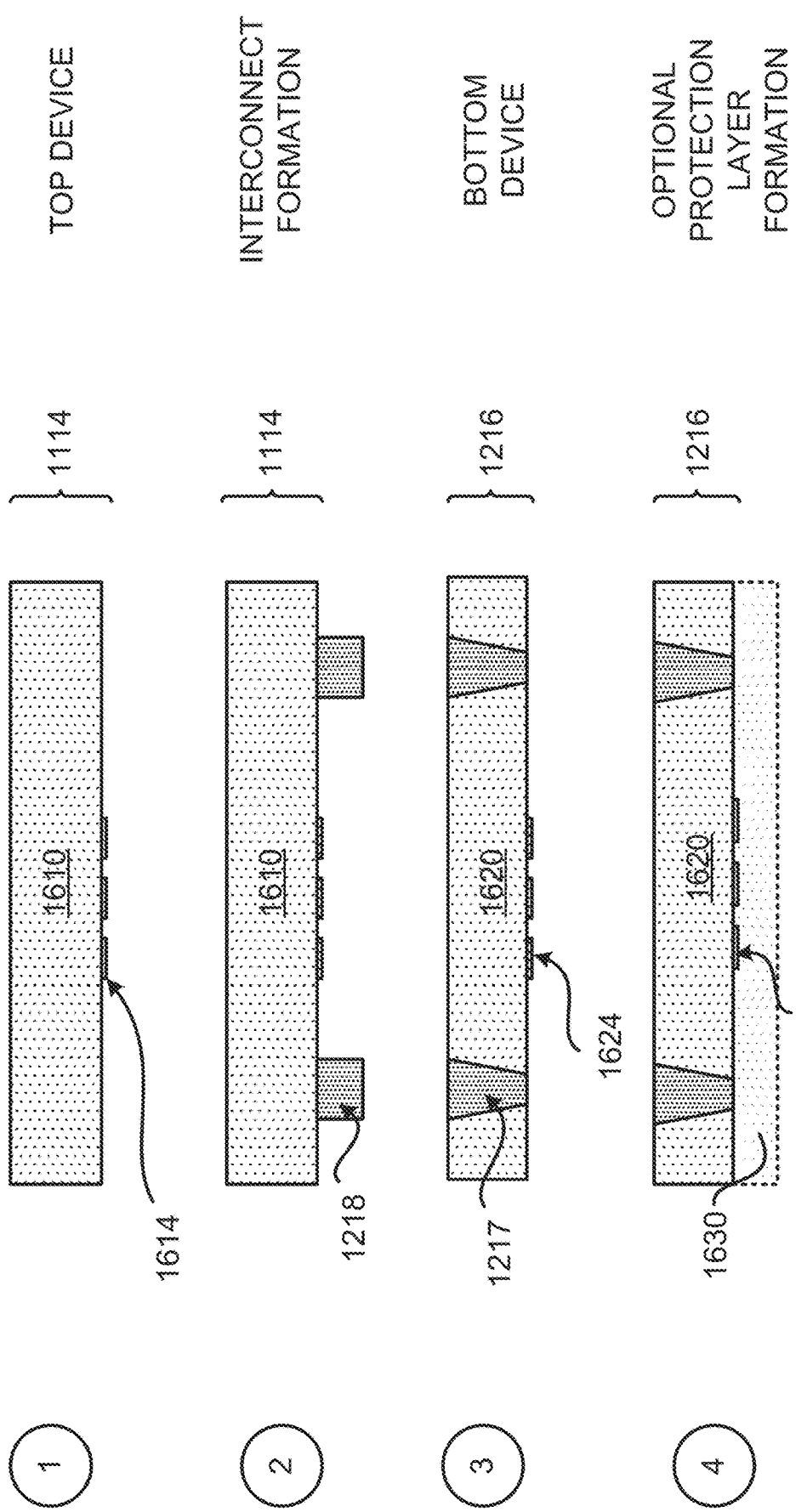
FIGS. 17A-17B illustrate an exemplary sequence for fabricating a device comprising stacked integrated devices.
Figure 17B:
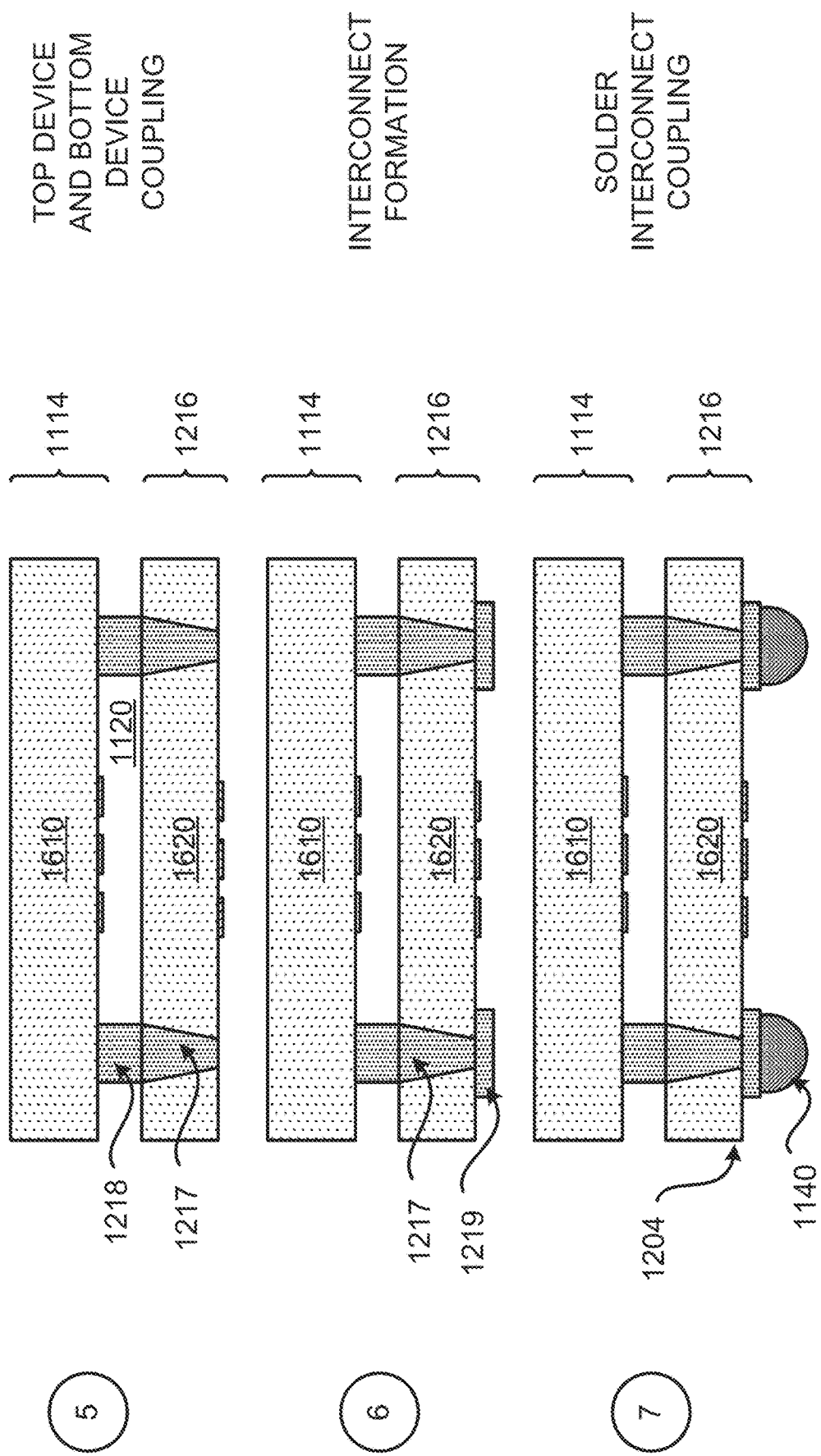

FIGS. 17A-17B illustrate an exemplary sequence for providing or fabricating a device that includes stacked integrated devices (e.g., stacked filters). In some implementations, the sequence of FIGS. 17A-17B may be used to provide or fabricate the stacked device 1204 of FIG. 12, or any of the stacked devices described in the disclosure.

It should be noted that the sequence of FIGS. 17A-17B may combine one or more stages in order to simplify and/or clarify the sequence for providing or fabricating a device that includes stacked integrated devices. In some implementations, the order of the processes may be changed or modified. In some implementations, one or more of processes may be replaced or substituted without departing from the spirit of the disclosure.

Stage 1, as shown in FIG. 17A, illustrates a state after an integrated device 1114 is provided. The integrated device 1114 may be configured as a filter. The integrated device 1114 includes a substrate 1610 and at least one metal layer 1614. The integrated device 1114 of FIG. 17A is similar or the same as the integrated device 1114 of FIG. 16A.

Stage 2 illustrates a state after an interconnect frame 1218 is coupled to the integrated device 1114. The interconnect frame 1218 may be coupled to the at least one metal layer 1614. A plating process may be used to form and couple the interconnect frame 1218 to the integrated device 1114.

However, different implementations may form and couple the interconnect frame 1218 differently.

Stage 3, illustrates a state after an integrated device 1116 is provided. The integrated device 1116 may be configured as a filter. The integrated device 1216 may be a bare die filter (e.g., SAW filter, BAW filter). The integrated device 1116 includes a substrate 1620, at least one metal layer 1624, and at least one via 1217. The integrated device 1116 of FIG. 17A is similar to the integrated device 1116 of FIG. 16A. The at least one via 1217 may travel through the substrate 1620.

Stage 4 illustrates a state after an optional protection layer 1630 is formed over the substrate 1620 and the at least one metal layer 1624. The protection layer 1630 may be deposited over the substrate 1620 and the at least one metal layer 1624.

Stage 5, as shown in FIG. 17B illustrates a state after the integrated device 1114 is coupled to the integrated device 1116 such that a void 1120 is formed between the integrated device 1114, the integrated device 1216 and the interconnect frame 1218. The interconnect frame 1218 may be coupled to the at least one via 1217. As mentioned above, the interconnect frame 1218 may be coupled to the at least one metal layer 1614. A thermal compression process may be used to couple the integrated device 1114 to the integrated device 1216. If a protection layer 1630 is formed, the protection layer 1630 may be removed after coupling the integrated device 1114 to the integrated device 1216.

Stage 6 illustrates a state after a plurality of interconnects 1219 is formed over the surface of the integrated device 1216. The plurality of interconnects 1219 may be coupled to the at least one via 1217 and the at least one metal layer 1624. The at least one via 1217 may be coupled to the at least one metal layer 1624. A platting process, a sputtering process and/or a spray process may be used to form the plurality of interconnects 1219.

Stage 7 illustrates a state after the plurality of solder interconnects 1140 is coupled to the plurality of interconnects 1219. A reflow solder process may be used to couple the plurality of solder interconnects 1140 to the plurality of interconnects 1219. Stage 7 may illustrate the stacked device 1204 as shown in FIG. 12.

Exemplary Electronic Devices

Figure 18:
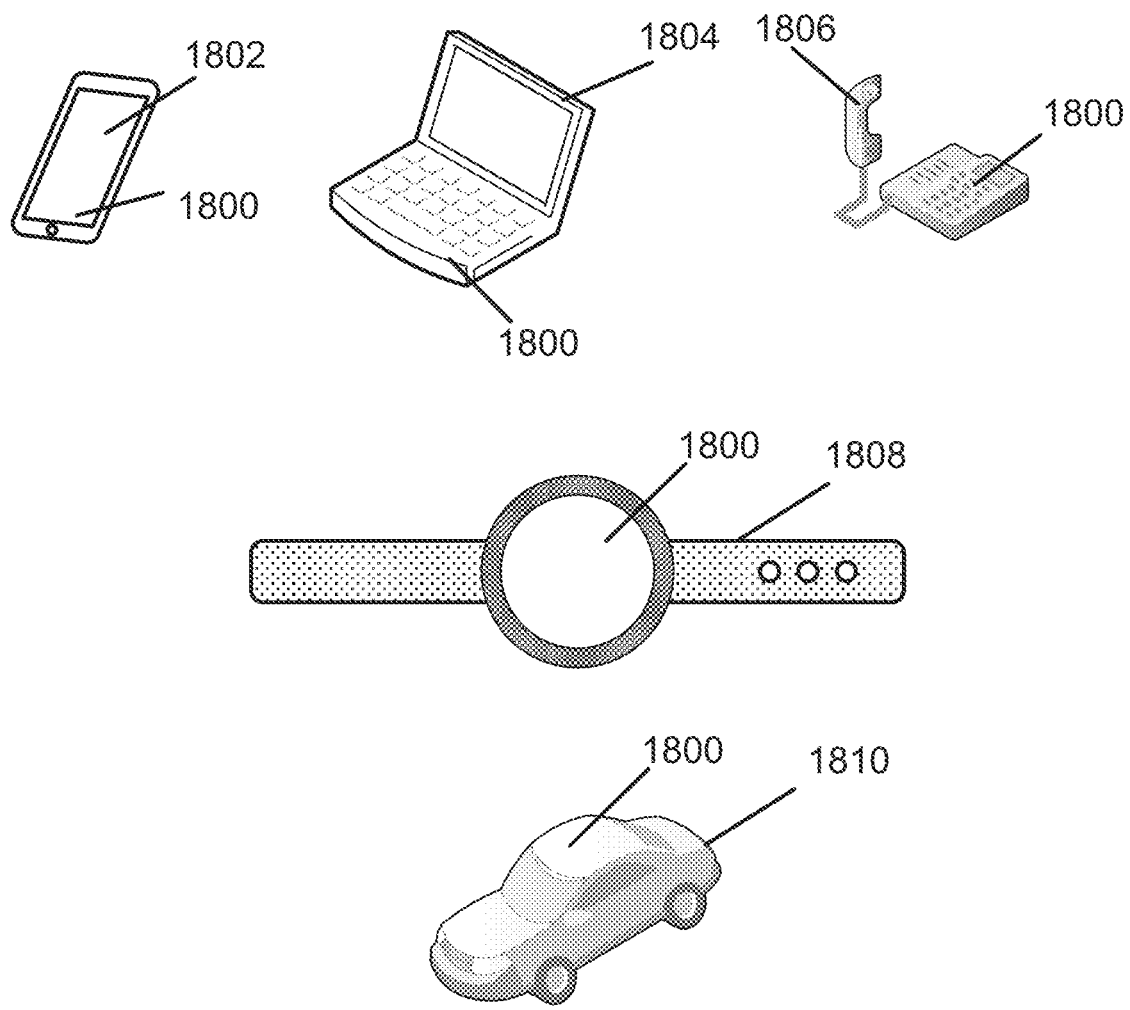
FIG. 18 illustrates various electronic devices that may integrate a die, an integrated device, an integrated passive device (IPD), a passive component, a package, and/or a device package described herein.

FIG. 18 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1802, a laptop computer device 1804, a fixed location terminal device 1806, a wearable device 1808, or automotive vehicle 1810 may include a device 1800 as described herein. The device 1800 may be, for example, any of the devices and/or integrated circuit (IC) packages described herein. The devices 1802, 1804, 1806 and 1808 and the vehicle 1810 illustrated in FIG. 18 are merely exemplary. Other electronic devices may also feature the device 1800 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-12, 13A-13D, 14, 15A-15C, 16A-16B, 17A-17B and/or 18 may be rearranged and/or combined into a single component, process, feature or function or embodied in several components, processes, or functions. Additional elements, components, processes, and/or functions may also be added without departing from the disclosure. It should also be noted FIGS. 2-12, 13A-13D, 14, 15A-15C, 16A-16B, 17A-17B and/or 18 and its corresponding description in the present disclosure is not limited to dies and/or ICs. In some implementations, FIGS. 2-12, 13A-13D, 14, 15A-15C, 16A-16B, 17A-17B and/or 18 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "surrounded" means that the object may partially surround or completely surround another object. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., a data signal), ground and/or power. An interconnect may include more than one element or component. An interconnect may be defined by one or more interconnects. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package comprising:
    a substrate comprising a first surface and a cavity;
    an integrated device coupled to the first surface of the substrate;
    a stacked device coupled to the substrate, wherein the stacked device is located at least in the cavity of the substrate;
    a first encapsulation layer located over the first surface of the substrate and the integrated device, wherein the first encapsulation layer includes an undercut relative to a side surface of the integrated device;
    a void located between the integrated device and the first surface of the substrate, wherein the void is laterally surrounded by the undercut of the first encapsulation layer; and
    a second void located between the stacked device and the substrate, wherein the second void is at least part of the cavity of the substrate,
    wherein the package is free of a sealing film between the first encapsulation layer and the integrated device, and
    wherein the first encapsulation layer has a uniform thickness over a top surface of the integrated device.

2. The package of claim 1, wherein the undercut of the first encapsulation layer relative to the side surface of the integrated device, is in a range of −20-50 micrometers (μm).

3. The package of claim 1,
    wherein a shape of the void is defined at least by the undercut of the first encapsulation layer, and
    wherein the package is free of an adhesive between the first encapsulation layer and the void.

4. The package of claim 1, further comprising a second encapsulation layer located over the first encapsulation layer, wherein the first encapsulation layer has a uniform thickness over at least a portion of a side surface of the integrated device.

5. The package of claim 4, wherein the second encapsulation layer has a different property than the first encapsulation layer.

6. The package of claim 4, wherein the second encapsulation layer has a second coefficient of thermal expansion (CTE) that is either (i) greater than a first CTE of the first encapsulation layer, or (ii) lower than the first CTE of the first encapsulation layer.

7. The package of claim 1, wherein the substrate has a substrate CTE that is within 15 parts per million/Kelvin (ppm/K) of an effective CTE of the integrated device and the first encapsulation layer.

8. The package of claim 1, wherein the substrate has a substrate CTE that is within 15 parts per million/Kelvin (ppm/K) of an effective CTE of a rest of the package.

9. The package of claim 1, wherein the stacked device being located at least in the cavity of the substrate comprises at least part of the stacked device being located in the cavity of the substrate.

10. The package of claim 1, wherein the stacked device includes a second integrated device and a third integrated device.

11. The package of claim 1, wherein the stacked device includes a first bare die filter and a second bare die filter.

12. The package of claim 1, wherein the integrated device includes a radio frequency (RF) device, a passive device, a filter, a capacitor, an inductor, a surface acoustic wave (SAW) filter, a bulk acoustic wave (BAW) filter, a processor, a memory, and/or combinations thereof.

13. The package of claim 1, further comprising:
    a second encapsulation layer located over the first encapsulation layer; and
    an electromagnetic interference (EMI) shield located over the second encapsulation layer.

14. The package of claim 13, further comprising:
a second integrated device coupled to a second surface of the substrate; and
a third encapsulation layer coupled to the second surface of the substrate, and encapsulating the second integrated device.

15. An apparatus comprising:
a substrate comprising a first surface and a cavity;
an integrated device coupled to the first surface of the substrate;
a stacked device coupled to the substrate, wherein the stacked device is located over the cavity of the substrate;
means for first encapsulation located over the first surface of the substrate and the integrated device, wherein the means for first encapsulation includes an undercut relative to a side surface of the integrated device;
a void located between the integrated device and the first surface of the substrate, wherein the void is laterally surrounded by the undercut of the means for first encapsulation; and
a second void located between the stacked device and the substrate, wherein the second void is at least part of the cavity of the substrate,
wherein the apparatus is free of an adhesive between the void and the means for first encapsulation, and
wherein the apparatus is free of a sealing film between the means for first encapsulation and the integrated device.

16. The apparatus of claim 15, wherein the undercut of the means for first encapsulation relative to the side surface of the integrated device, is in a range of −20-50 micrometers (μm).

17. The apparatus of claim 15, wherein a shape of the void is defined at least by the undercut of the means for first encapsulation.

18. The apparatus of claim 15, further comprising means for second encapsulation located over the means for first encapsulation, wherein the means for second encapsulation has a different property than the means for first encapsulation.

19. The apparatus of claim 18, wherein the means for second encapsulation has a second coefficient of thermal expansion (CTE) that is greater than a first CTE of the means for first encapsulation.

20. The apparatus of claim 15, wherein the substrate has a substrate CTE that is within 15 parts per million/Kelvin (ppm/K) of an effective CTE of the integrated device and the means for first encapsulation.

21. The apparatus of claim 15, wherein the substrate has a substrate CTE that is approximately between 5-20 parts per million/Kelvin (ppm/K).

22. The apparatus of claim 15, wherein the stacked device being located over the cavity of the substrate comprises at least part of the stacked device being located in the cavity of the substrate.

23. The apparatus of claim 15, wherein the stacked device includes a second integrated device and a third integrated device.

24. The apparatus of claim 15, wherein the stacked device includes a means for first signal filtering and a means for second signal filtering.

25. The apparatus of claim 15, wherein the integrated device includes a radio frequency (RF) device, a passive device, a filter, a capacitor, an inductor, a surface acoustic wave (SAW) filter, a bulk acoustic wave (BAW) filter, a processor, a memory, and/or combinations thereof.

26. The apparatus of claim 15, further comprising:
means for second encapsulation located over the means for first encapsulation; and
means for electromagnetic interference (EMI) shielding located over the means for second encapsulation.

27. The apparatus of claim 26, further comprising:
a second integrated device coupled to a second surface of the substrate; and
means for third encapsulation coupled to the second surface of the substrate, and encapsulating the second integrated device.

28. The apparatus of claim 15, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

29. A method for fabricating a package, comprising:
providing a substrate comprising a first surface and a cavity;
coupling an integrated device to the first surface of the substrate; and
coupling a stacked device to the substrate such a second void is located between the stacked device and the substrate,
wherein the second void is at least part of the cavity of the substrate, and
wherein the stacked device is located at least in the cavity of the substrate;
forming a first encapsulation layer over the first surface of the substrate and the integrated device,
wherein the first encapsulation layer includes an undercut relative to a side surface of the integrated device,
wherein forming the first encapsulation layer forms a void located between the integrated device and the first surface of the substrate,
wherein the void is laterally surrounded by the undercut of the first encapsulation layer,
wherein a shape of the void is at least defined by the undercut of the first encapsulation layer, and
wherein the package is fabricated such that the package is free of a sealing film between the first encapsulation layer and the integrated device.

30. The method of claim 29, wherein the undercut of the first encapsulation layer relative to the side surface of the integrated device, is in a range of −20-50 micrometers (μm).

31. The method of claim 29, wherein the first encapsulation layer is formed such that the first encapsulation layer has a uniform thickness over a top surface of the integrated device.

32. The method of claim 29, further comprising forming a second encapsulation layer over the first encapsulation layer.

33. The method of claim 32, wherein the second encapsulation layer has a different property than the first encapsulation layer.

* * * * *